(12) United States Patent
Cordes et al.

(10) Patent No.: US 7,416,104 B2
(45) Date of Patent: Aug. 26, 2008

(54) ROTATIONAL FILL TECHNIQUES FOR INJECTION MOLDING OF SOLDER

(75) Inventors: Steven A. Cordes, Yorktown Heights, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 11/409,232

(22) Filed: Apr. 21, 2006

(65) Prior Publication Data
US 2007/0246515 A1   Oct. 25, 2007

(51) Int. Cl.
*B23K 31/02* (2006.01)

(52) U.S. Cl. ...................... 228/103; 228/256

(58) Field of Classification Search ............ None
See application file for complete search history.

(56) References Cited

U.S. PATENT DOCUMENTS

| | | | |
|---|---|---|---|
| 5,244,143 A | 9/1993 | Ference et al. | |
| 6,332,569 B1 | 12/2001 | Cordes et al. | |
| 6,390,439 B1 | 5/2002 | Cordes et al. | |
| 7,322,511 B2 * | 1/2008 | Farrar et al. | 228/180.21 |
| 2001/0035450 A1 * | 11/2001 | Mannhart et al. | 228/105 |
| 2004/0108368 A1 * | 6/2004 | Onishi et al. | 228/248.1 |
| 2004/0238595 A1 * | 12/2004 | Nogiwa et al. | 228/49.5 |

OTHER PUBLICATIONS

Advanced Packaging Magazine, Nov. 2005.
Gruber, et al., "Low-cost wafer bumping," IBM Research and Development, vol. 49, No. 4.5, Jul./Sep. 2005, pp. 621-639.
Technology Roadshow 2005 for Advanced Packaging, MEMS and Nanotechnologies.

* cited by examiner

*Primary Examiner*—Kiley Stoner
(74) *Attorney, Agent, or Firm*—Kevin M. Jordan; Jose Gutman; Fleit Gibbons Gutman Bongini & Bianco P.L.

(57) ABSTRACT

A system and method for injection molding conductive bonding material into a plurality of cavities in a non-rectangular mold is disclosed. The method comprises aligning a fill head with a non-rectangular mold. The non-rectangular mold includes a plurality of cavities. The fill head is placed in substantial contact with the non-rectangular mold. Rotational motion is provided to at least one of the non-rectangular mold and the fill head while the fill head is in substantial contact with the non-rectangular mold. Conductive bonding material is forced out of the fill head toward the non-rectangular mold. The conductive bonding material is provided into at least one cavity of the plurality of cavities contemporaneous with the at least one cavity being in proximity to the fill head.

1 Claim, 25 Drawing Sheets

ROTATIONAL FILL TECHNIQUES FOR INJECTION MOLDING OF SOLDER

CROSS REFERENCE TO RELATED APPLICATION

The present patent application is related to co-pending and commonly owned U.S. patent application Ser. No. 11/409,242, entitled "Universal Mold For Injection Molding Of Solder"; U.S. patent application Ser. No. 11/409,233, entitled "FILL HEAD FOR INJECTION MOLDING OF SOLDER;" and U.S. patent application Ser. No. 11/409,244, entitled "CONDUCTIVE BONDING MATERIAL FILL TECHNIQUES", all filed on even date with the present patent application, the entire collective teachings of which being hereby incorporated by reference.

FIELD OF THE INVENTION

The present invention generally relates to the field of placement of conductive bonding material such as solder on electronic pads, and more particularly relates to fill techniques for injection molding of solder on integrated circuit chip pads.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. One process for forming solder balls is carried out by an evaporation method of lead and tin through a mask for producing the desired solder balls.

One problem with through-mask evaporation is that material is used very inefficiently. The efficiency of material use is becoming increasingly important as recent materials requirements such as ultra-low alpha lead and Pb-free drive have increased material costs. Another problem with through-mask evaporation is that when the bump pitch falls below 225 µm, yields begin to degrade with evaporation. Additionally, longer evaporation times are required with Pb-free solders. Yet a further problem with evaporation methods is that 300-mm evaporation masks used for 300-mm wafers are not very stable or robust.

Other solder ball formation techniques that are capable of solder-bumping a variety of substrates have also been proposed such as solder plating and solder paste screening. In solder plating a layer of solder is applied directly to a conductive pattern. The solder coating can be used as an etch mask. These techniques work fairly well in bumping semiconductor substrates that contain solder structures over a minimum size. One of the more popularly used techniques is a solder paste screening technique which can be used to cover the entire area of an 8 inch wafer. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself. Pastes are generally composed of a flux and solder alloy particles. The consistency and uniformity of the solder paste composition become more difficult to control with a decreasing solder bump volume.

A possible solution for this problem is the utilization of solder pastes that contain extremely small and uniform solder particles. However, this can only be done at a high cost penalty. Another problem in using the solder paste screening technique in modern high density devices is the reduced pitch between bumps. Since there is a large reduction in volume from a screened paste to the resulting solder bump, the screen holes must be significantly larger in diameter than the final bumps. The stringent dimensional control of the bumps makes the solder paste screening technique impractical for applications in high density devices.

A more recently developed injection molded solder ("IMS") technique attempted to solve these problems by dispensing molten solder instead of solder paste. However, problems have been observed when the technique is implemented to wafer shaped substrates. U.S. Pat. No. 5,244,143, which is commonly owned by International Business Machines Corporation, discloses the injection molded solder technique and is hereby incorporated by reference in its entirety. One of the advantages of the IMS technique is that there is very little volume change between the molten solder and the resulting solder bump. The IMS technique utilizes a solder head that fills molds of various materials such as boro-silicate glass, silicon, polymers, metals, and the like that are wide enough to cover most single chip modules. Excess solder is removed as the solder head moves about the mold. The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped. One problem with current IMS systems is that they have been restricted to linear deposition of solder into rectangular molds. That is, the mold and the solder head are moved linearly with respect to each other such that the cavities move perpendicular to a slit in the solder head thereby filling the cavities as they pass. The molds are limited to a rectangular configuration.

Therefore a need exists to overcome the problems with the prior art as discussed above.

SUMMARY OF THE INVENTION

Briefly, in accordance with the present invention, disclosed are a system and method for injection molding conductive bonding material into a plurality of cavities in a non-rectangular mold. The method comprises aligning a fill head with a non-rectangular mold. The non-rectangular mold includes a plurality of cavities. The fill head is placed in substantial contact with the non-rectangular mold. Rotational motion is provided to at least one of the non-rectangular mold and the fill head while the fill head is in substantial contact with the non-rectangular mold. Conductive bonding material is forced out of the fill head toward the non-rectangular mold. The conductive bonding material is provided into at least one cavity of the plurality of cavities contemporaneous with the at least one cavity being in proximity to the fill head.

In another embodiment of the present invention a system for injection molding conductive bonding material into a plurality of cavities in a non-rectangular mold is disclosed. The system comprises at least one non-rectangular mold including at least one cavity. At least one conductive bonding material placement device for providing conductive bonding material into the at least one cavity of the at least one non-rectangular mold is also included.

The conductive bonding material placement device comprises a fill head for aligning the fill head with the at least one non-rectangular mold. The device also places the fill head in substantial contact with the at least one non-rectangular mold. A conductive material reservoir is also included in the placement device. The reservoir is mechanically coupled to the fill head for providing conductive bonding material to the fill head from the material reservoir. The system also comprises a means for providing rotational motion to at least one of the fill head and the at least one non-rectangular mold while the fill head is in substantial contact with the at least one non-rectangular mold.

An advantage of the foregoing embodiments of the present invention is that non-rectangular molds or substrates can be filled using an IMS system. The present invention allows for molds that more closely resemble their associated wafer to be used. Furthermore, the fill heads of the present invention provide a means for channeling gases throughout the fill head for keeping conductive bonding material molten and for solidifying the conductive bonding material in a more controlled and accurate fashion.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

Figure 1:
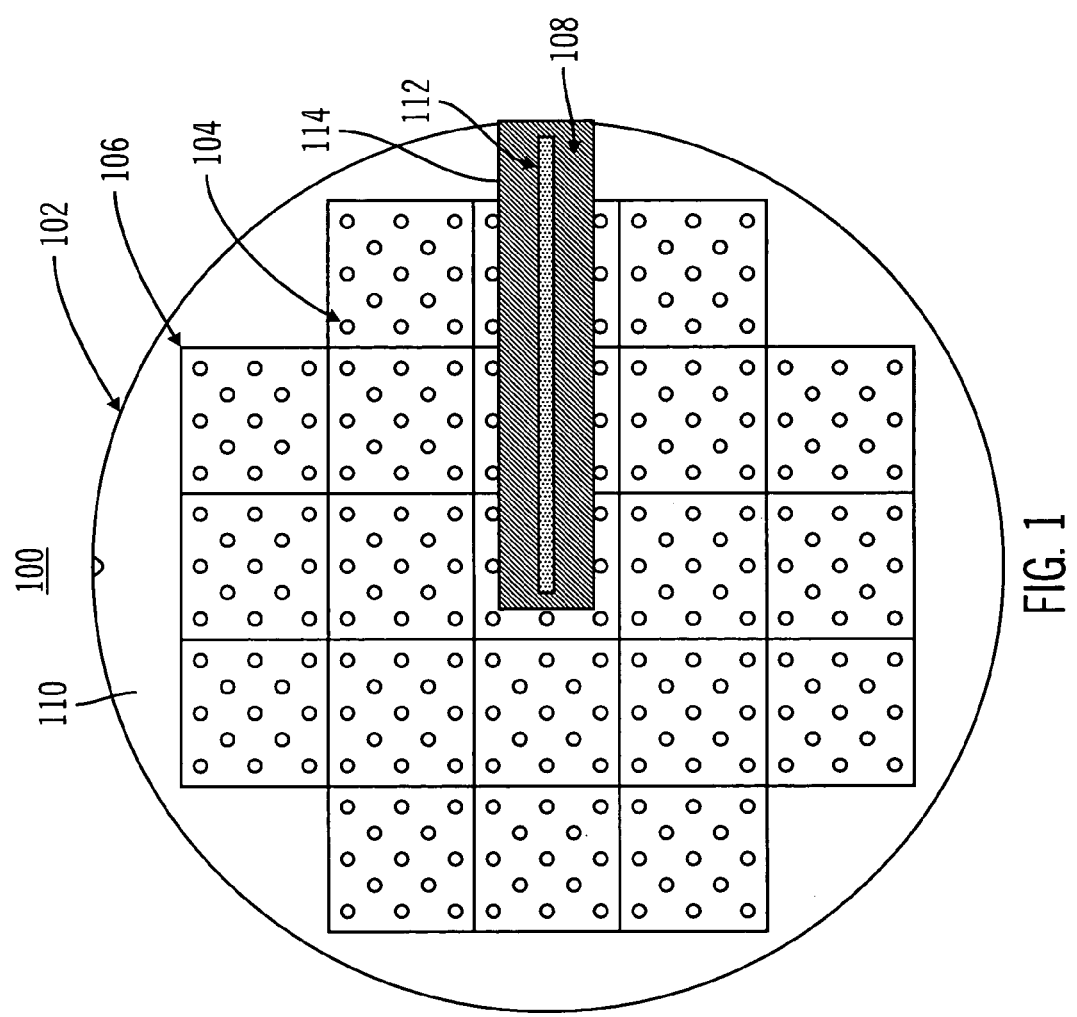
FIGS. 1-5 are top views of an IMS system illustrating a progressive sequence of filling cavities in a non-rectangular mold with conductive bonding material using a rotational fill technique that implements a fill head of a first type, according to an embodiment of the present invention.
Figure 2:
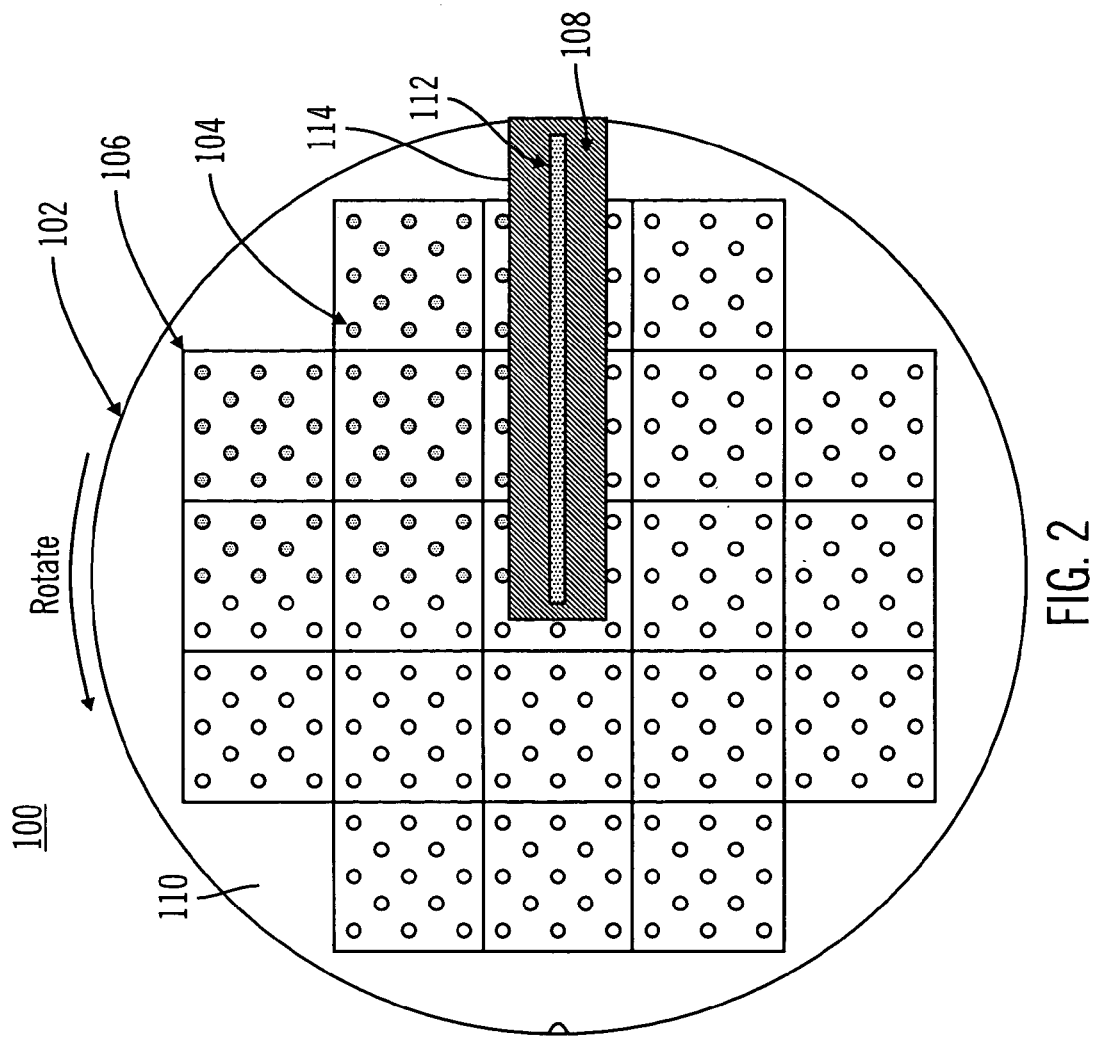
Figure 3:
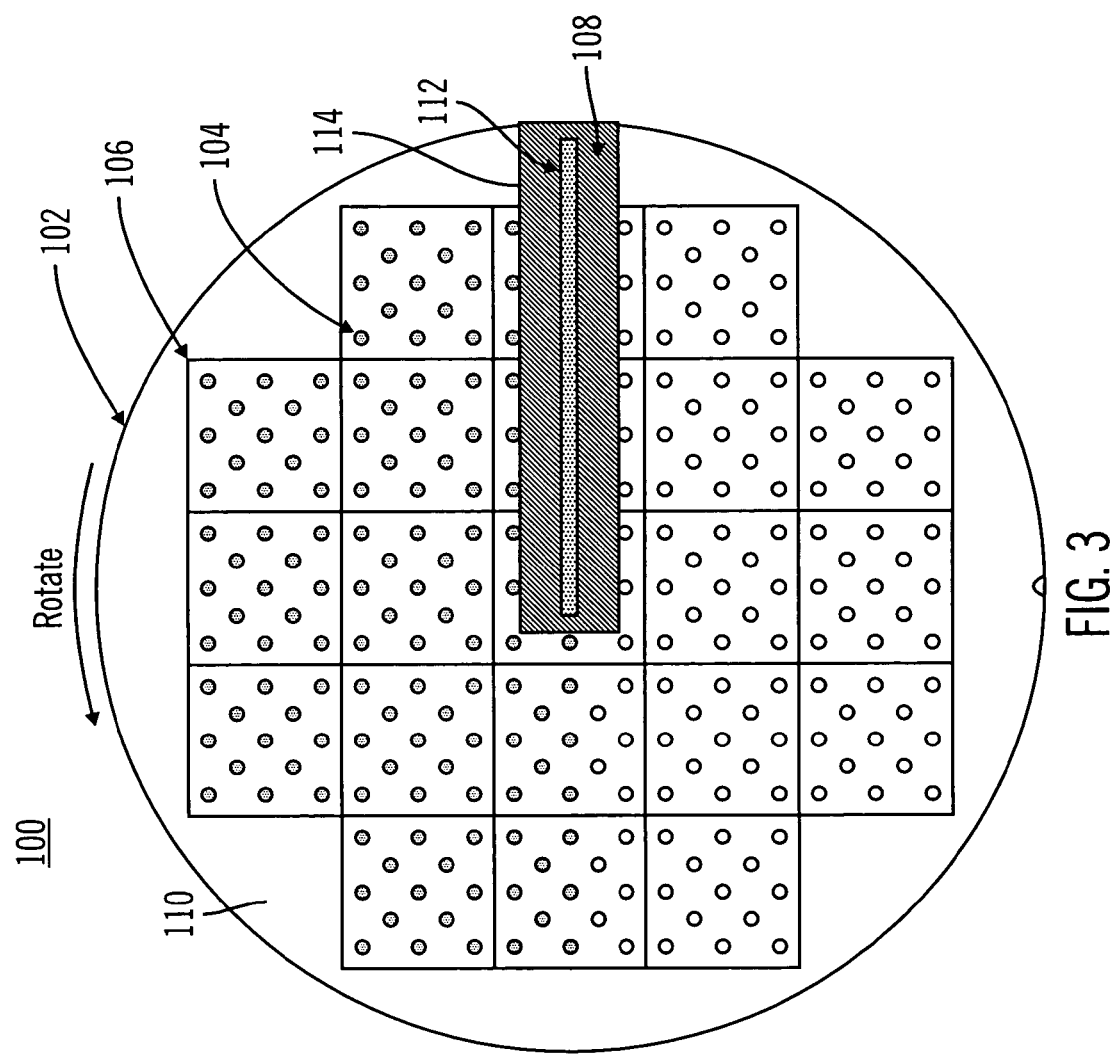
Figure 4:
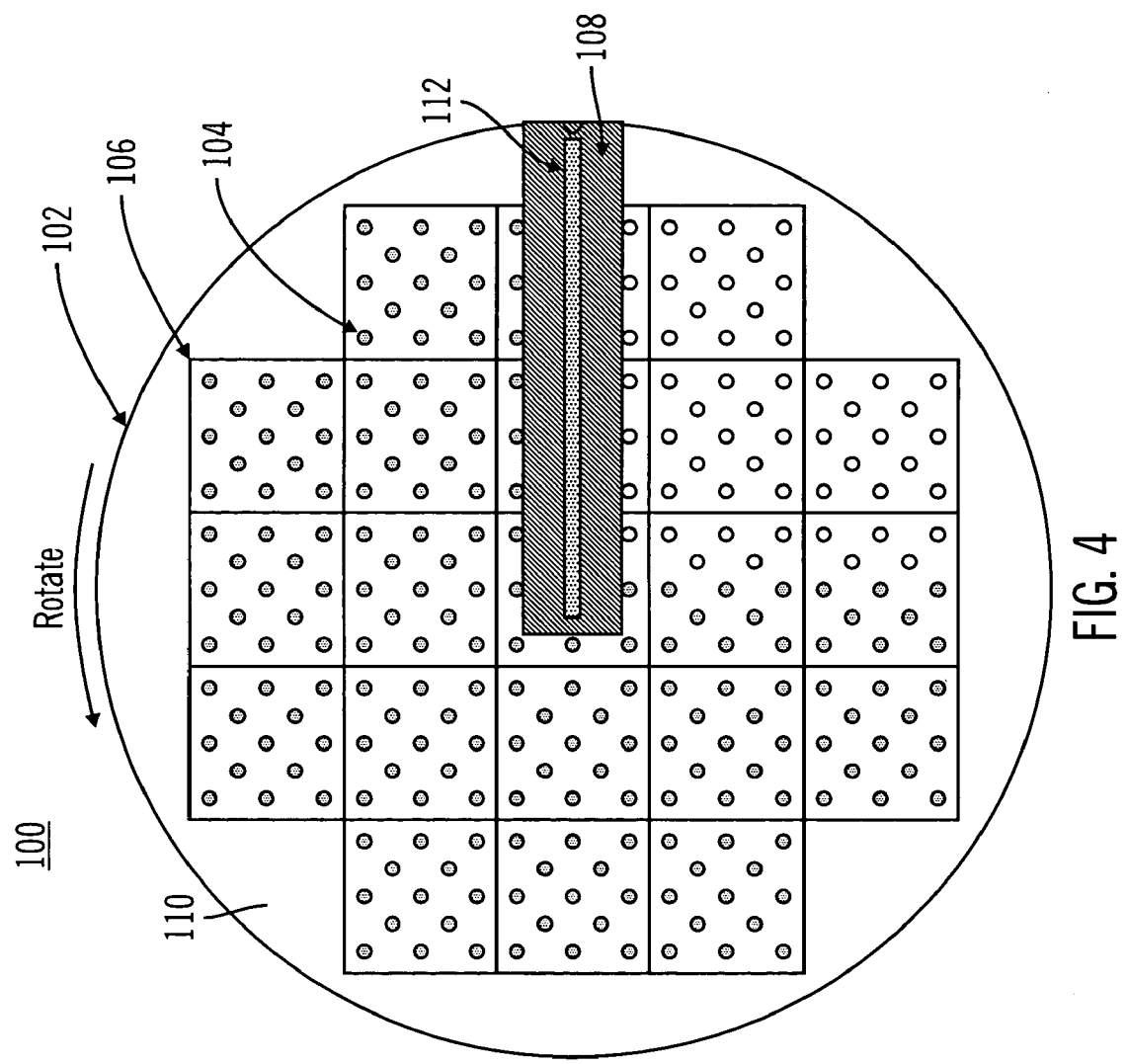
Figure 5:
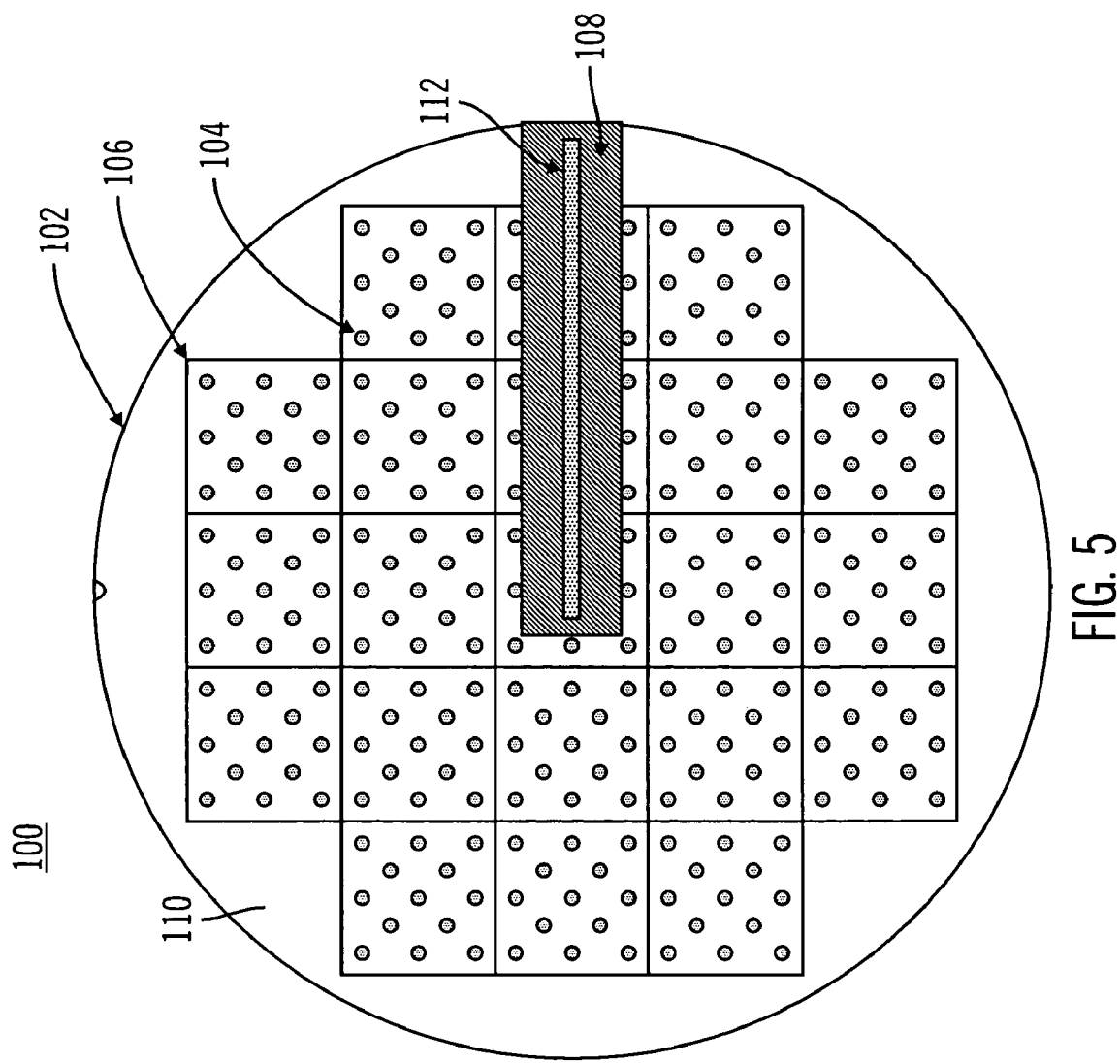
Figure 6:
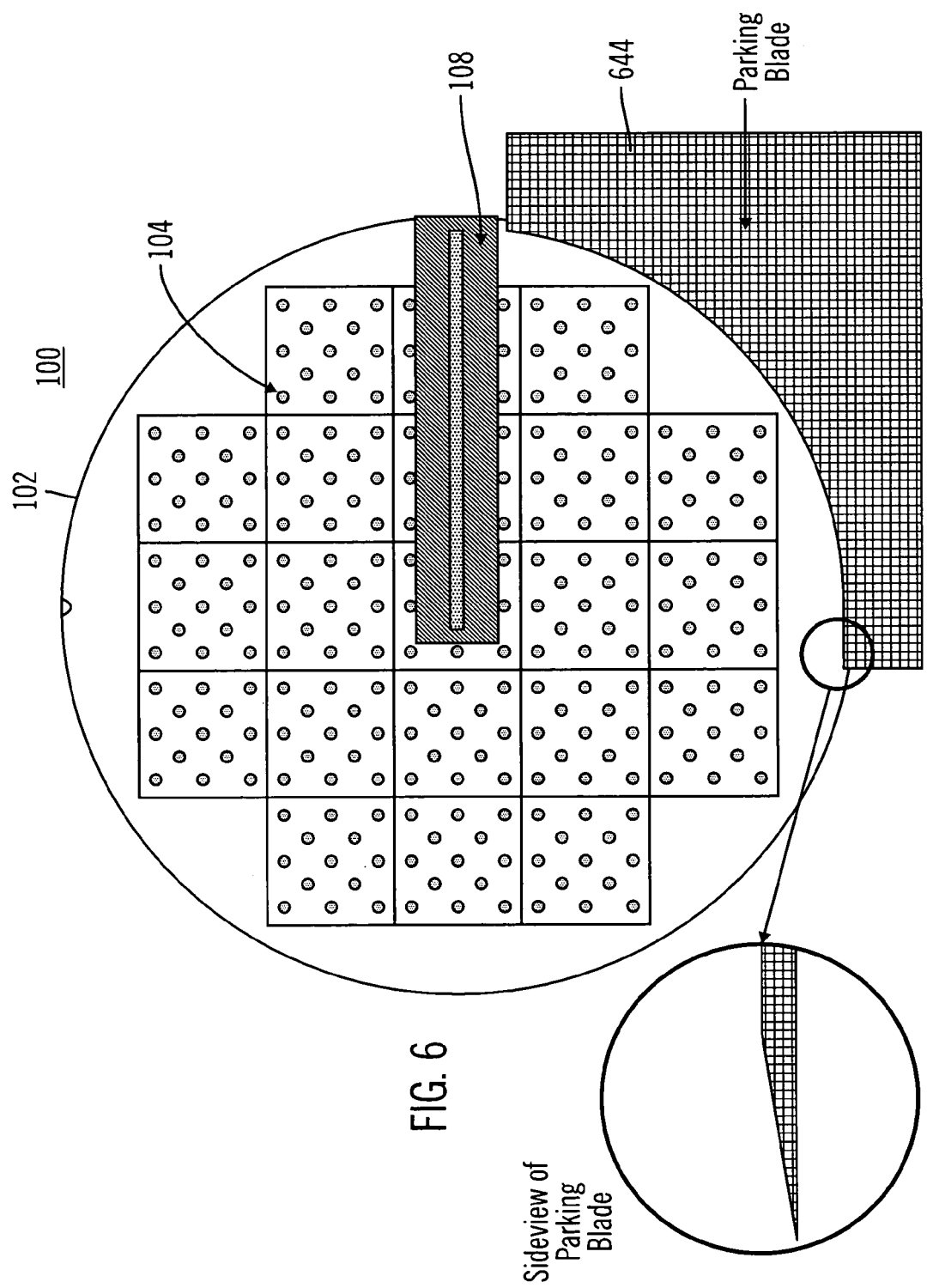
FIGS. 6-9 are top views of an IMS system illustrating a progressive sequence of transitioning the fill head of the first type from a non-rectangular mold after filling cavities in the mold with a conductive bonding material, according to an embodiment of the present invention.
Figure 7:
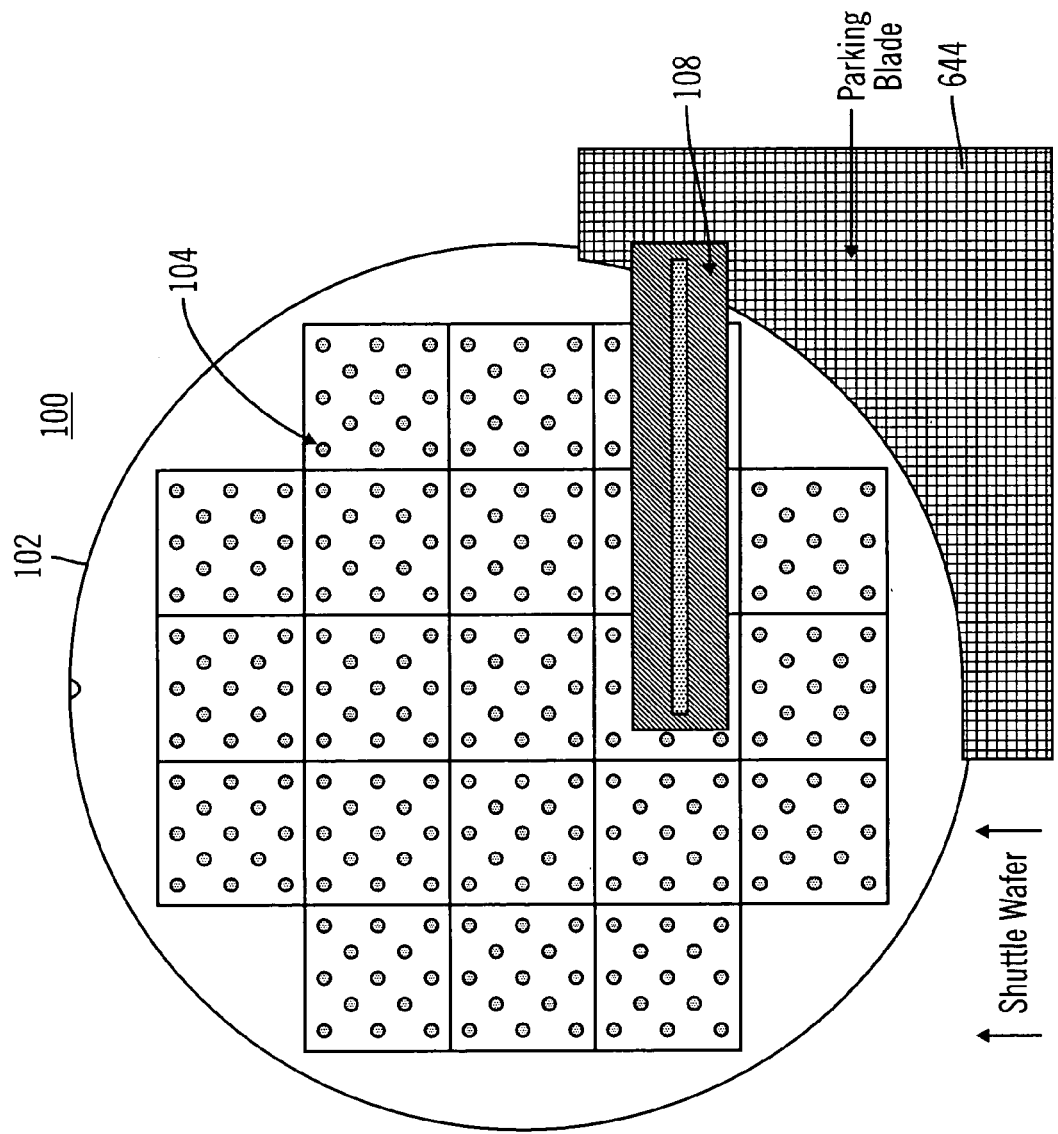

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The present invention, according to an embodiment, overcomes problems with the prior art by providing techniques for filling non-rectangular molds or substrates using an IMS system. The present invention allows for molds that more closely resemble their associated wafer to be used. Furthermore, the fill heads of the present invention provide a means for channeling gases throughout the fill head for melting and solidifying conductive bonding material. Non-rectangular molds allow for the flexibility in mold materials and processing techniques. For example, silicon has the advantage of manufacturability and can be etched very accurately. Additionally, the use of non-rectangular molds allows for the depositing of conductive bonding materials directly on the product.

Exemplary IMS System for Rotational Fill Techniques Implementing

According to an embodiment of the present invention FIGS. 1-5 show a progressive sequence of an exemplary IMS system 100 utilizing rotational fill techniques. The exemplary IMS system 100 includes a non-rectangular mold 102. The non-rectangular mold 102, in one embodiment, is circular, however, other non-rectangular configurations may also be used according to the present invention. For example, the mold 102 may comprise oval, hexagonal, triangular, star, or any combination of these shapes. In one embodiment, the non-rectangular mold 102 corresponds to a silicon wafer. In one embodiment, the non-rectangular mold 102 is comprised of glass, silicon, metal, or the like. For example, borosilicate glass has the same coefficient of thermal expansion as a silicon wafer. In another embodiment a material such as molybdenum, which is biased, can be used for a mold to correct for mismatched coefficient of thermal expansion between the mold and a wafer.

The non-rectangular mold 102 comprises a plurality of cavities 104 corresponding to wetting pads (not shown) on a wafer (not shown). The square boundaries 106 represent chip boundaries and are for illustrative purposes only. In one embodiment, the cavities 104 are formed by applying polyimide to the borosilicate glass surface. The polyimide layer is then laser processed to produce cavities 104 in the polyimide layer only. In another embodiment, wet etching is used to form the cavities 104. However, the present invention is not limited to these two processes for forming cavities as should be well understood by those of ordinary skill in the art in view of the present discussion.

A fill head 108 is also included in the IMS system 100. The fill head 108, in one embodiment, is made from glass, metal, graphite, or the like. The fill head 108 is configured so that it scans smoothly over a surface 110 of the non-rectangular mold 102. An exemplary fill head 108 has a smooth coating (not shown) on the surface of the fill head 108 facing the mold 102 of the fill head 108 with a low friction coefficient to ensure smooth scanning over the non-rectangular mold 102. For example, the smooth surface can be an o-ring or any other surface that allows for smooth scanning. A reservoir (not shown) is coupled to the fill head 108 for retaining material to be provided to the cavities 104 via the fill head 108. For example, a conductive organic material such as a conductive epoxy, a solder paste, an adhesive impregnated with conductors (e.g. metal particles), or the like is retained within the reservoir (not shown).

Throughout this disclosure the term solder will be used as an example of the type of material to be deposited into the cavities 104. The fill head 108 also includes a delivery slot (or slit) 112 that allows solder material to flow from the reservoir (not shown) into the cavities 104. The fill head 108 in one embodiment also includes at least one gas channel (not shown) comprising a gas having a temperature above the melting point of the solder. This causes the solder from the fill head 108 to more fully liquefy (melt) and to flow into the cavities 104. The fill head 108 will be discussed in greater detail below.

In one embodiment, an optional fill blade (not shown) is also coupled to the fill head 108. The optional fill blade (not shown) is situated on a portion of the fill head 108 that is in contact with the surface 110 of the mold. The optional fill blade (not shown) is situated so that the cavities 104 are filled prior to passing under the optional fill blade (not shown). The optional fill blade (not shown) prevents solder from leaking beyond the delivery slot (or slit) 112 as solder is provided to the cavities 104. When the optional fill blade (not shown) is situated against the surface 110 of the non-rectangular mold 102 a seal is created that allows air within the cavities to escape. The optional fill blade (not shown) is comprised of either a flexible or rigid material. In another embodiment, a fill blade is not required. For example, In another embodiment, the fill head 108 itself acts a fill blade. In this embodiment, a bottom surface of the fill head 108, which in one example is flat and smooth, is applied to the mold with enough pressure as to exhibit a squeegee effect across the mold 102.

FIGS. 1-5 show a fill head 108 situated along a radius of the non-rectangular mold 102. In one embodiment, the fill head 108 is slightly longer than the radius of the non-rectangular mold 102. FIGS. 2-5 show the IMS system 100 in 90 degree increments as either the fill head 108 is rotated about the center of the mold 102 or the non-rectangular mold 102 is rotated about its center, or both. It should be noted that rotational motion can be imparted to one or both of the non-rectangular mold 102 and the fill head 108. For example, the non-rectangular mold 102, in one embodiment, is rotated up to 360 degrees while the fill head 108 remains stationary. In another embodiment, the fill head 108 is rotated up to 360 degrees while the non-rectangular mold 102 remains stationary. In yet another embodiment, both the non-rectangular mold 102 and the fill head 108 are rotated relative to each other.

The rotational motion, in one embodiment, is continuous so that the non-rectangular mold 102 and/or the fill head 108 smoothly rotates without stopping. In another embodiment, the rotational force is applied in increments. Although the rotation is shown in a counter clockwise manner, the rotational motion can also be applied in a clockwise manner. Throughout this disclosure, an exemplary embodiment will be described wherein the fill head 108 remains stationary while the non-rectangular mold 102 is rotated. Additionally, even though in this example a single non-rectangular mold 102 and a single fill head 108 are shown, it should be understood by those of ordinary skill in the art in view of the present discussion that multiple non-rectangular molds 102 and/or multiple fill heads 108 can be combined in a system according to the present invention. Additionally, it should be understood that the non-rectangular mold 102 can be situated above or below the fill head 108, according to the present invention.

As the non-rectangular mold 102 is rotated about its center, the cavities 104 pass under the delivery slot (or slit) 112. Back pressure is applied to the solder in the reservoir (not shown) by, for example, injecting a gas such as nitrogen or argon into the reservoir (not shown). The back pressure forces molten solder to flow from the reservoir (not shown) to the delivery slot (or slit) 112 whereby the molten solder exits to the surface 110 of the non-rectangular mold 102. The fill head 108 remains in substantial contact with the surface 110 of the non-rectangular mold 102 as the non-rectangular mold 102 rotates. In one embodiment, the molten solder is directly deposited to a substrate itself such as a circuit supporting substrate without using a mold 102. In this embodiment, the substrate is non-rectangular and has cavities similar to the cavities 104 on the mold 102. The same procedure as described above with respect to the mold 102 is applicable when directly depositing solder onto a non-rectangular substrate.

The filling blade (not shown), which is also in substantial contact with the surface 110, exhibits a squeegee effect and guides the molten solder into the cavities 104 of the non-rectangular mold 102. Filled cavities are represented by the darkened circles in FIGS. 2-5. The fill head 108, according to one embodiment, also includes at least one gas channel (not shown) comprising a gas with a temperature below the melting point of the solder. This causes the molten or liquefied solder to solidify in the cavity 104 as the cavity passes under a trailing edge 114 of the fill head 108. The fill head 108 will be discussed in greater detail below.

One advantage of the present invention is the ability to fill non-rectangular molds with solder. Current IMS systems operate in a linear manner. That is, the mold and fill head move in a linear direction with respect to each other. Non-rectangular molds such as circular molds are desirable for use with circular wafers. The rotational fill techniques of the present invention allow non-rectangular molds such as circular molds to be filled without adapters. For example, prior art techniques place rectangular adapters on circular molds and scan a fill head in a linear direction across the mold.

After the non-rectangular mold 102 has been rotated up to 360 degrees all of the cavities 104 are filled. The fill head 108 then can transition to an adjacent mold (not shown). In one embodiment, as the fill head 108 is transitioning into mold to mold, the back pressure is released thereby causing the solder to retract back from the delivery slot (or slit) 112. However, in some instances the fill head 108 or a portion of the fill head 108 will extend beyond the non-rectangular mold 102 thereby exposing the delivery slot (or slit) 112 as it is transitioning. This can result in solder leaking out of the fill head either comprising the filled cavities and/or wasting the solder. To avoid this problem a parking blade 644, in one embodiment, is coupled to the edges of the non-rectangular mold 102 where the fill head 108 transitions to the next non-rectangular mold 102.

Figure 8:
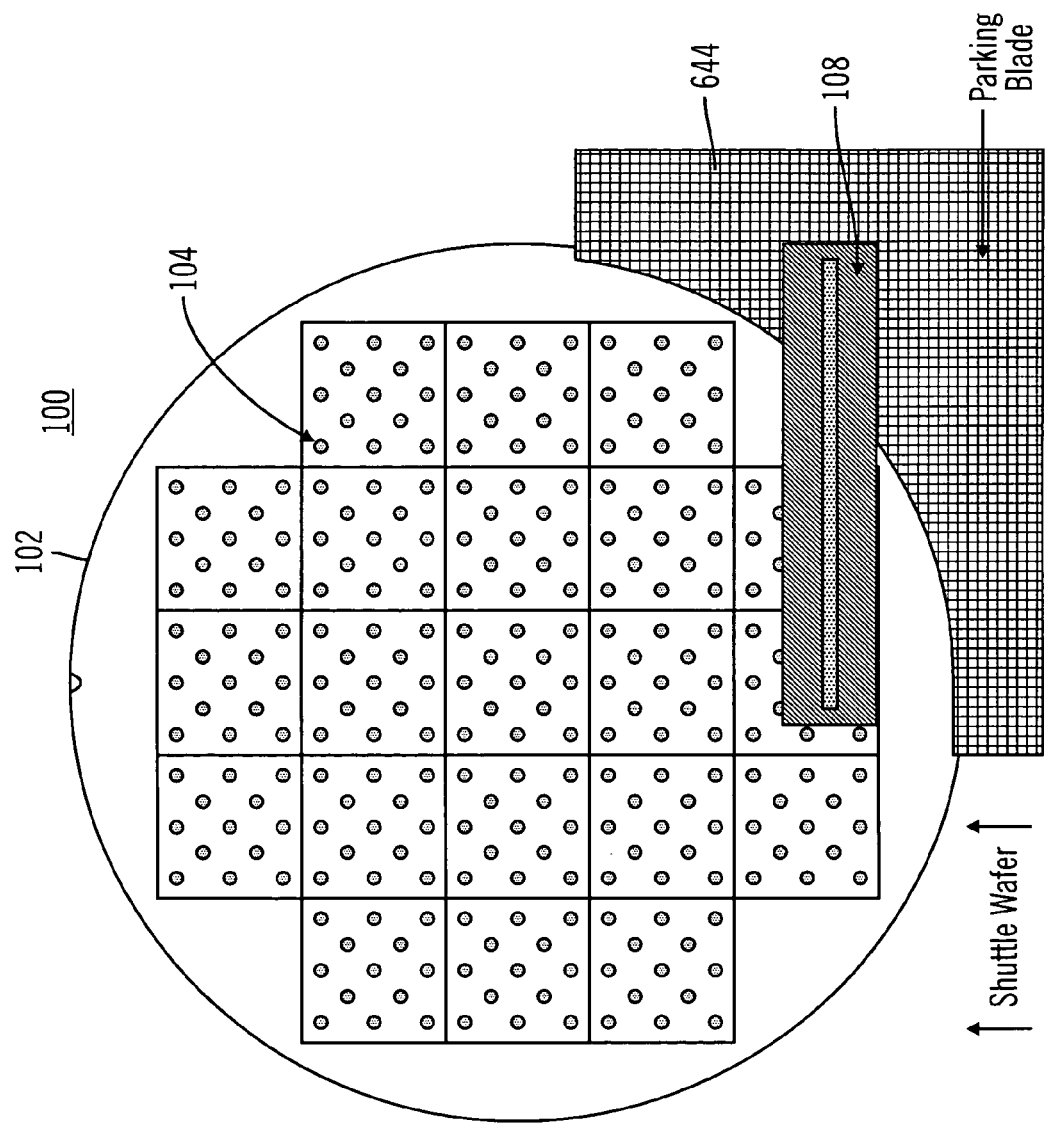
Figure 9:
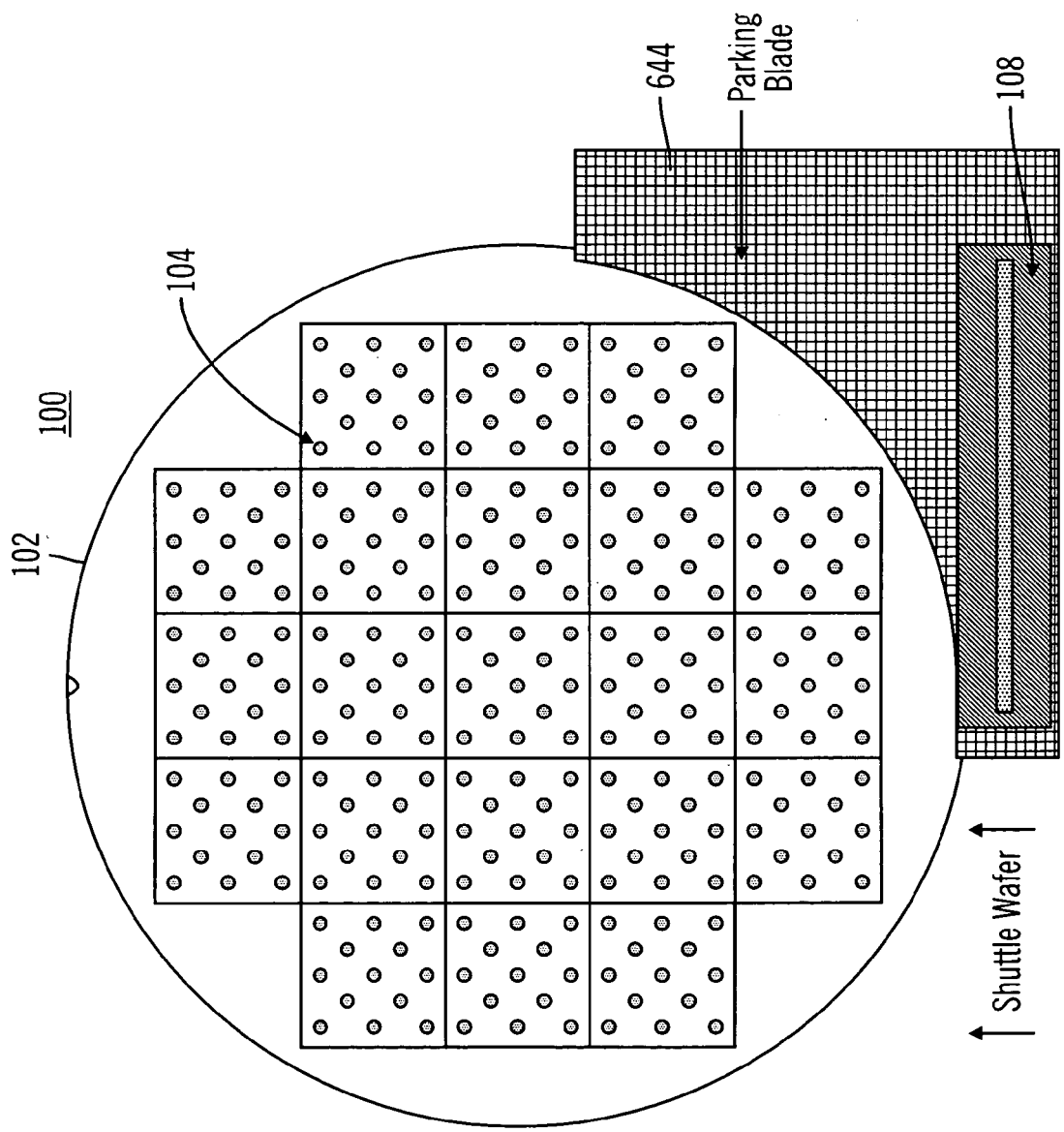

FIGS. 6-9 illustrate the embodiment where a parking blade 602 is coupled to the non-rectangular mold 102. Once the cavities 104 on the non-rectangular mold 102 have been filled with solder, the non-rectangular mold 102 is shuttled so that the fill head 108 transitions to the next mold (not shown). As the non-rectangular mold 102 is shuttled, a portion of the fill head 108 or the entire fill head 108 extends beyond the non-rectangular mold 102 as shown in FIGS. 8 and 9. The fill head 108 remains in substantial contact with the parking blade 602 thereby preventing spillage of the solder.

Exemplary IMS System Utilizing a Fill Head of a Second Type

Figure 10:
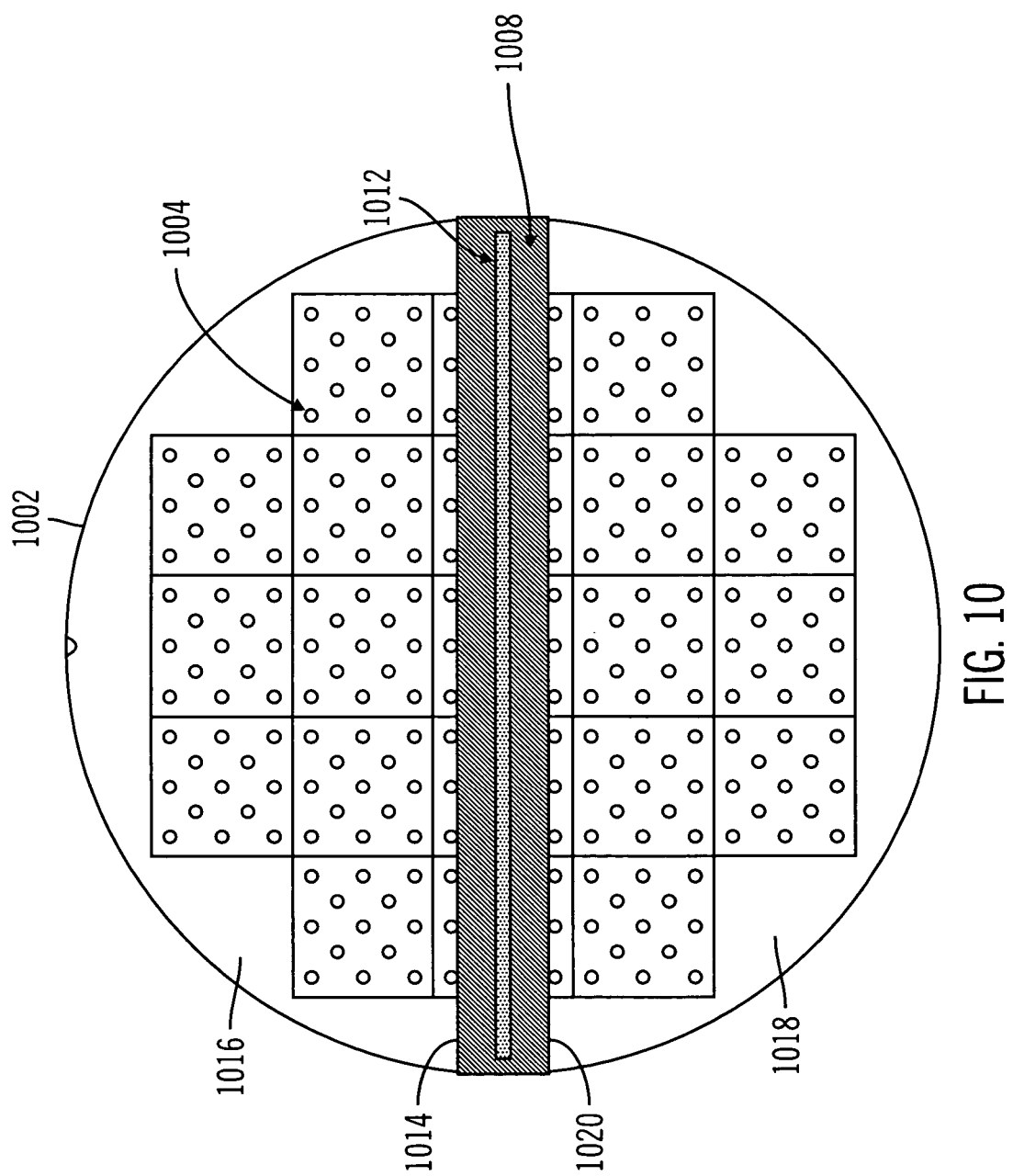
FIGS. 10-12 are top views of an IMS system illustrating a progressive sequence of filling cavities in a non-rectangular mold with a conductive bonding material using a rotational fill technique that implements a fill head of a second type, according to an embodiment of the present invention.
Figure 11:
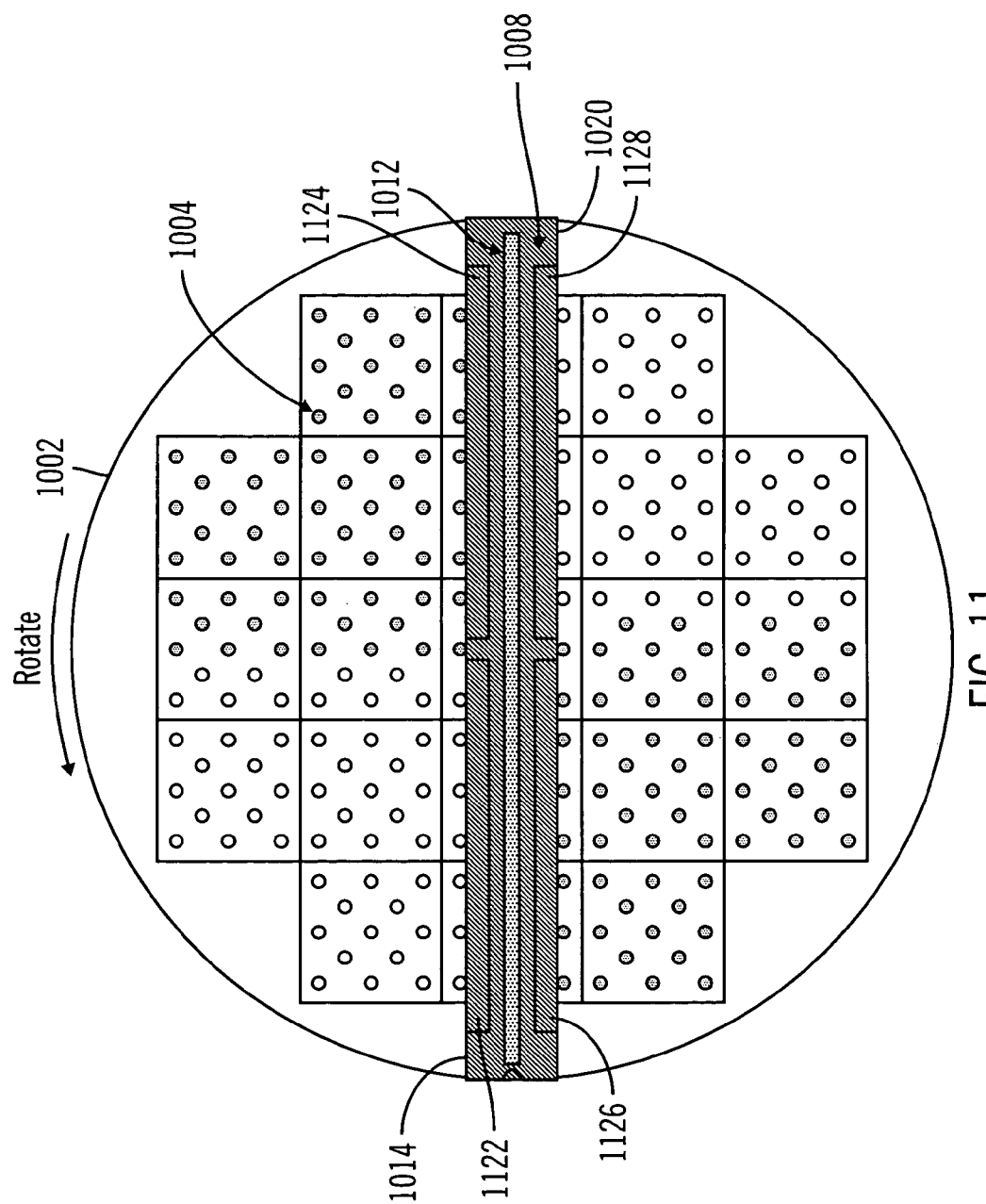
Figure 12:
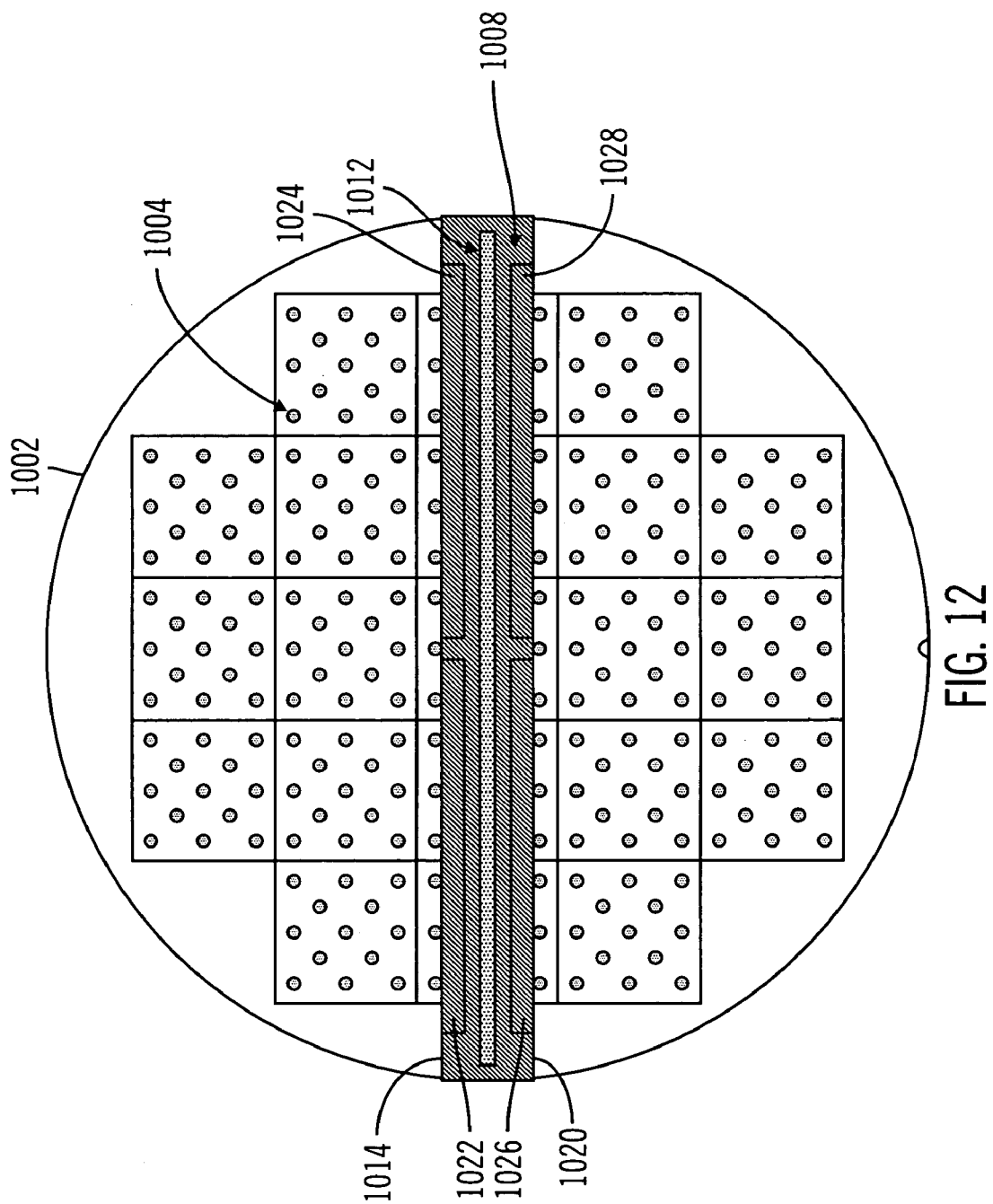

FIGS. 10-12 illustrate another embodiment of the present invention wherein the fill head 1008 is slightly longer than a diameter of the non-rectangular mold 1002. FIGS. 10-12 show a progressive sequence at 90 degree intervals of the non-rectangular mold 1002 being rotated up to 180 degrees. The fill head 1008 is aligned along the diameter of the non-rectangular mold 1002. As the non-rectangular mold 1002 is rotated about its center, molten solder flows from the delivery slot 1012 and onto the surface 1010 of the non-rectangular mold. As the non-rectangular mold 1002 is rotated, the filling blade (not shown) guides the molten solder into the cavities 1004. In this embodiment, the fill head 1008 is bi-directional. In other words, the fill head 1008 fills the cavities 1004 in two directions. For example, cavities 1004 situated on the upper half 1016 of the non-rectangular mold 1002 are filled from an opposite direction as the cavities 1004 situated on the bottom half 1018 of the non-rectangular mold 1002.

The non-rectangular mold 1002 only needs to be rotated up to 180 degrees in order for all of the cavities 1004 to be filled. Therefore, one advantage of the present invention is that the fill time of cavities 1004 is controllable by using different fill heads 108, 1008. In one embodiment, the fill head 1008 includes a set of gas channels 1122, 1124, 1126, 1128 (FIG. 11) on a first edge 1014 and a second edge 1020 of the fill head 1008. For example, FIGS. 11-12 show a first gas channel 1122 and a second gas channel 1124 on the front edge 1014 of the fill head 1008 and a third gas channel 1126 and a fourth gas channel 1128 on the back edge 1020 of the non-rectangular mold 1002. In one embodiment, the first and fourth gas channels 1122, 1128 include a gas with a temperature above the melting point of the solder and the second and third gas channels 1126 include a gas having a temperature below the melting point of the solder. This configuration of the gas channels 1122, 1124, 1126, 1128 allows for the cavities 104 to be filled in a counter clockwise direction and have the molten solder solidified in the cavities as the pass under the opposite edge of the fill head 108 The gas channels 1122, 1124, 1126, 1128 are inversed when the rotation is clockwise. In another embodiment the first and fourth gas channels 1122, 1128 and the second and third gas channels 1126, 1128 are mechanically coupled to each other, respectively.

Figure 13:
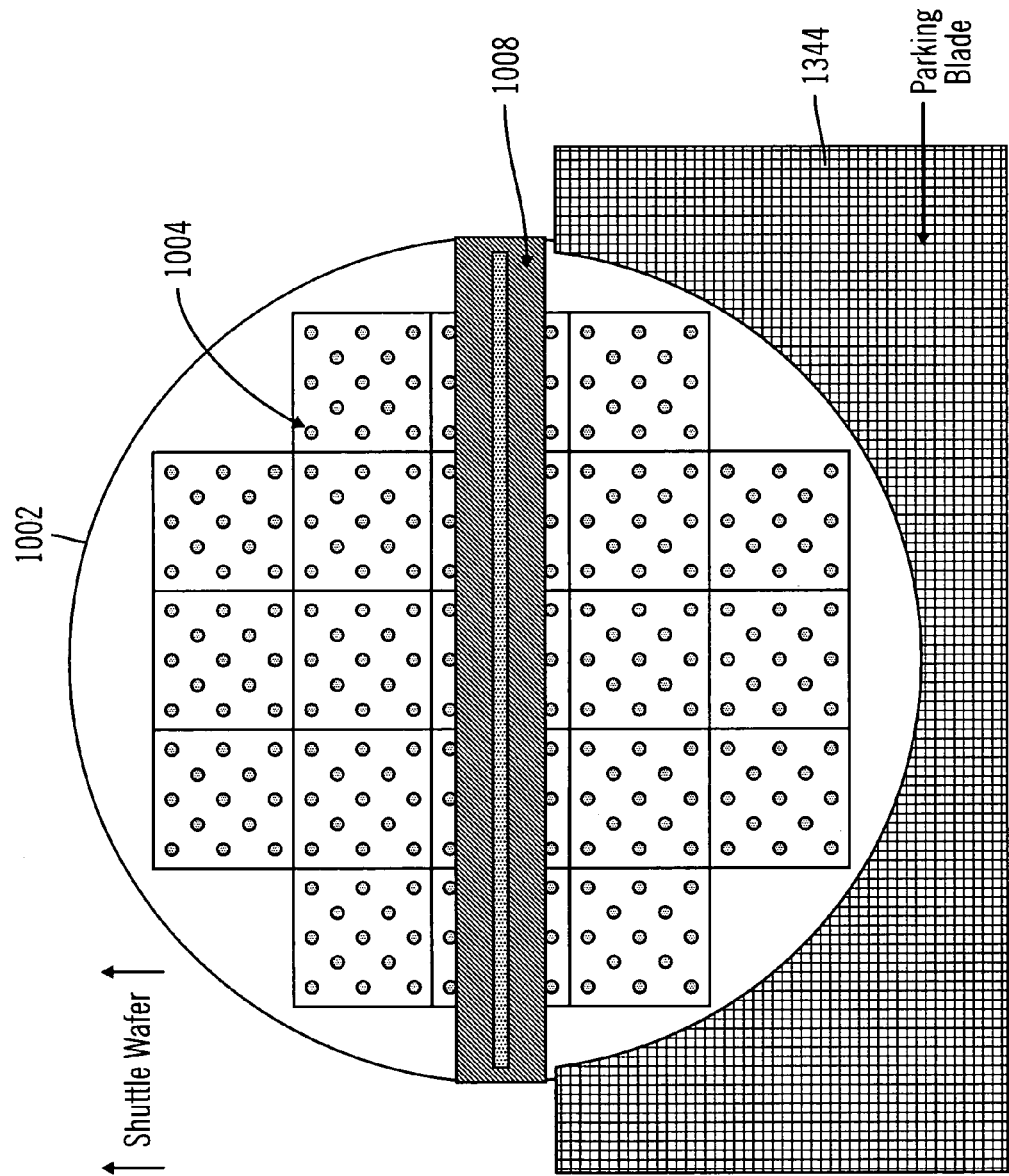
FIGS. 13-15 are top views of an IMS system illustrating a progressive sequence of transitioning the fill head of the second type from a non-rectangular mold after filling cavities in the mold with a conductive bonding material, according to an embodiment of the present invention.
Figure 14:
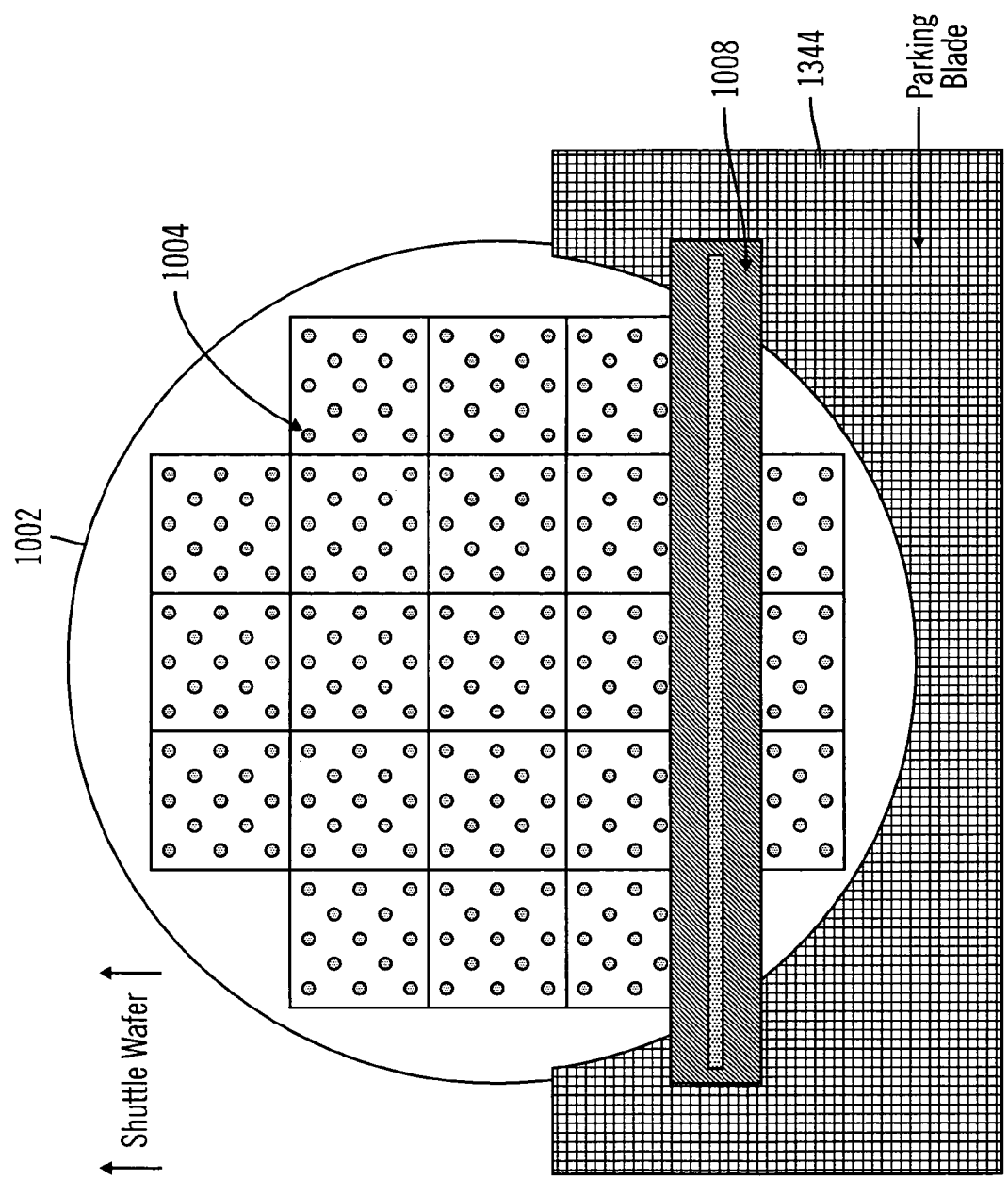
Figure 15:
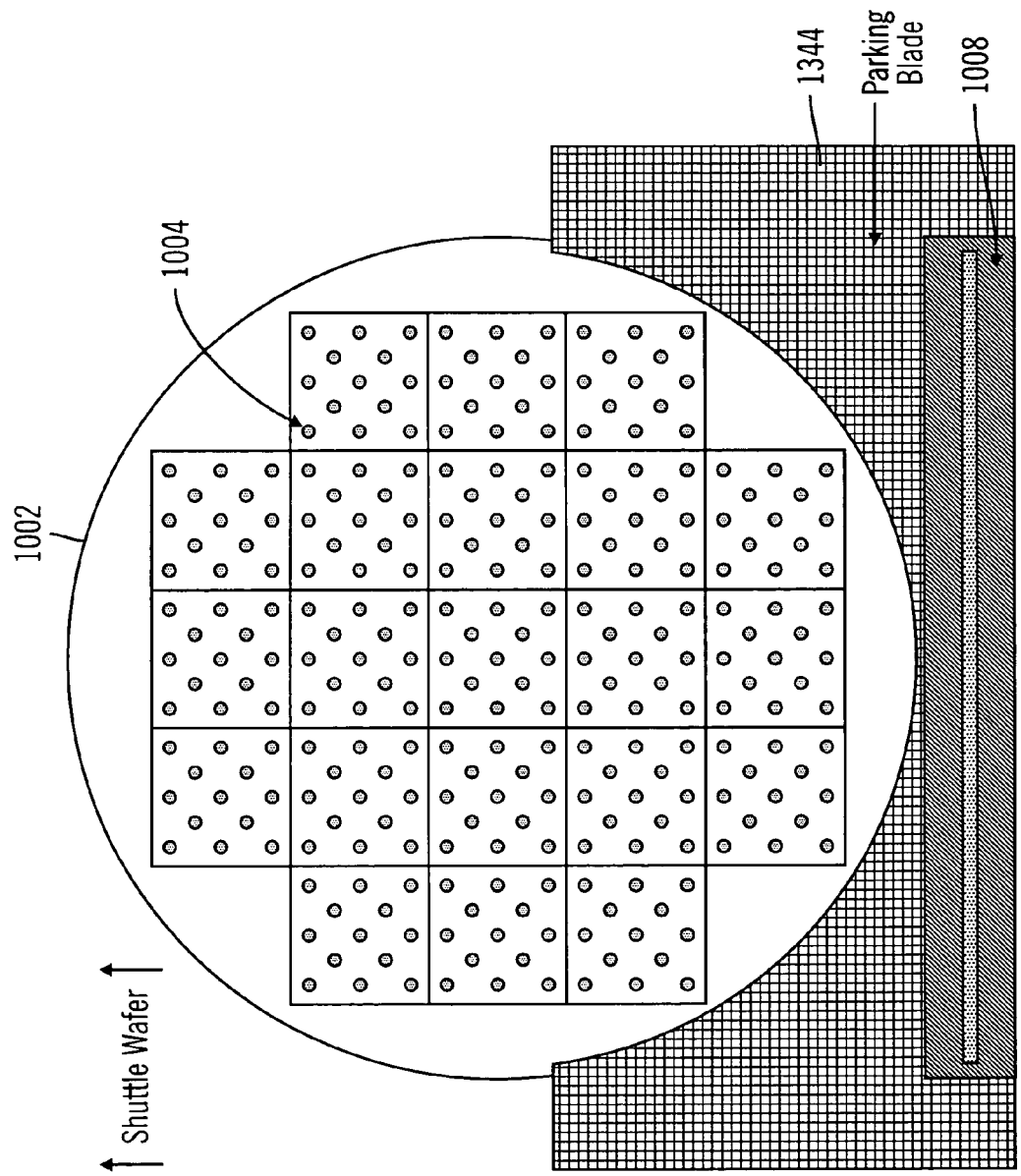
Figure 16:
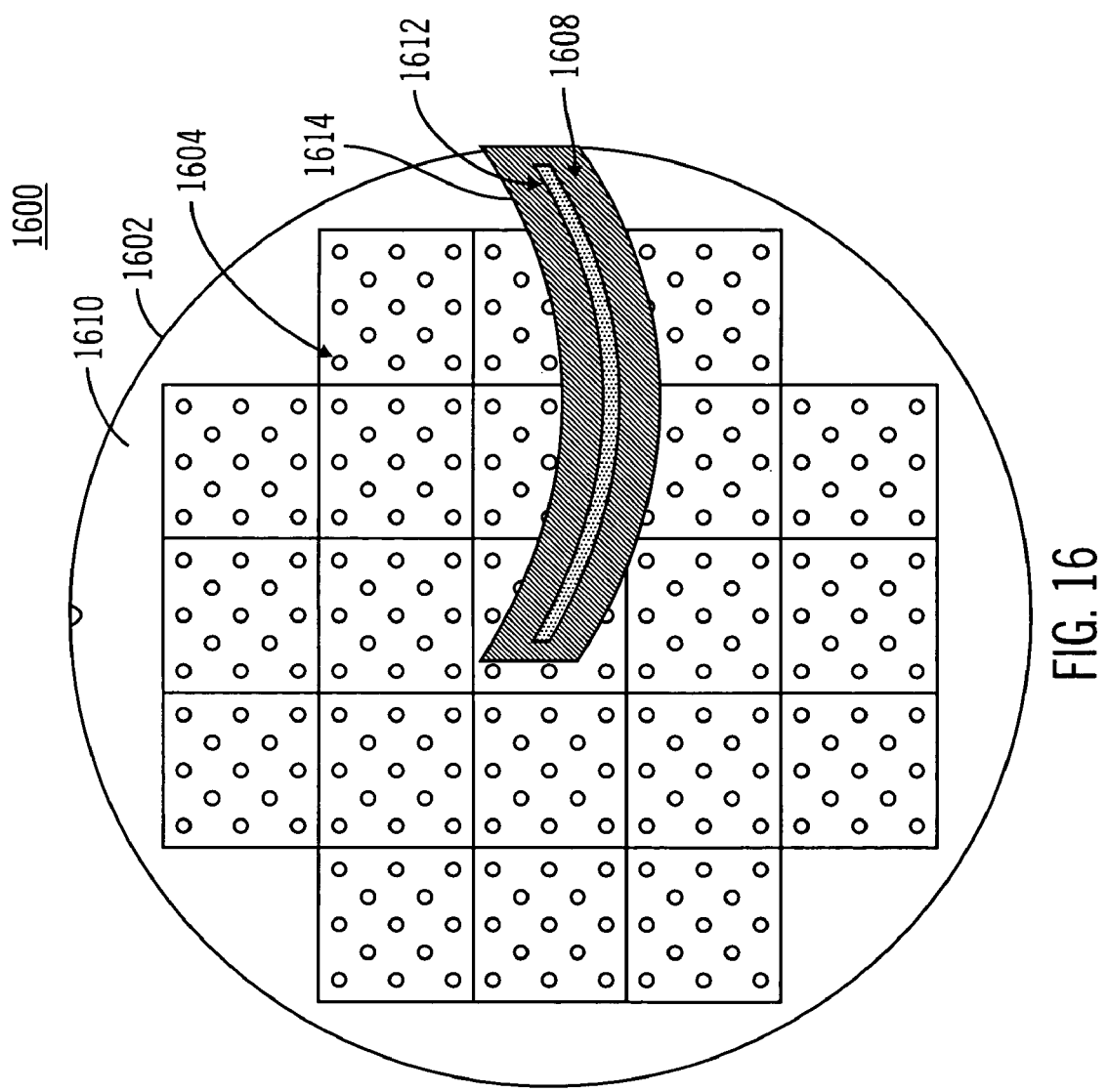
FIGS. 16-20 are top views of an IMS system illustrating a progressive sequence of filling cavities in a non-rectangular mold with a conductive bonding material using a rotational fill technique that implements a fill head of a third type, according to an embodiment of the present invention.
Figure 17:
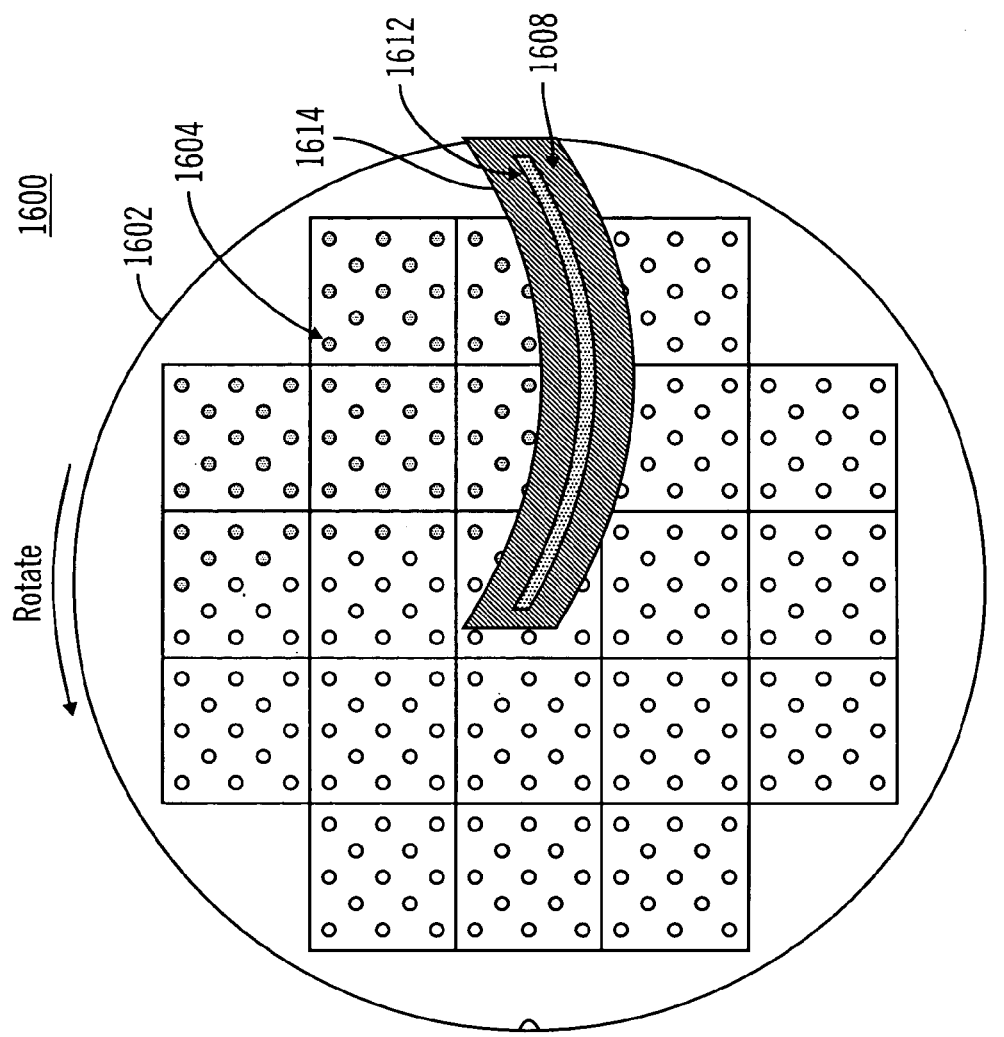
Figure 18:
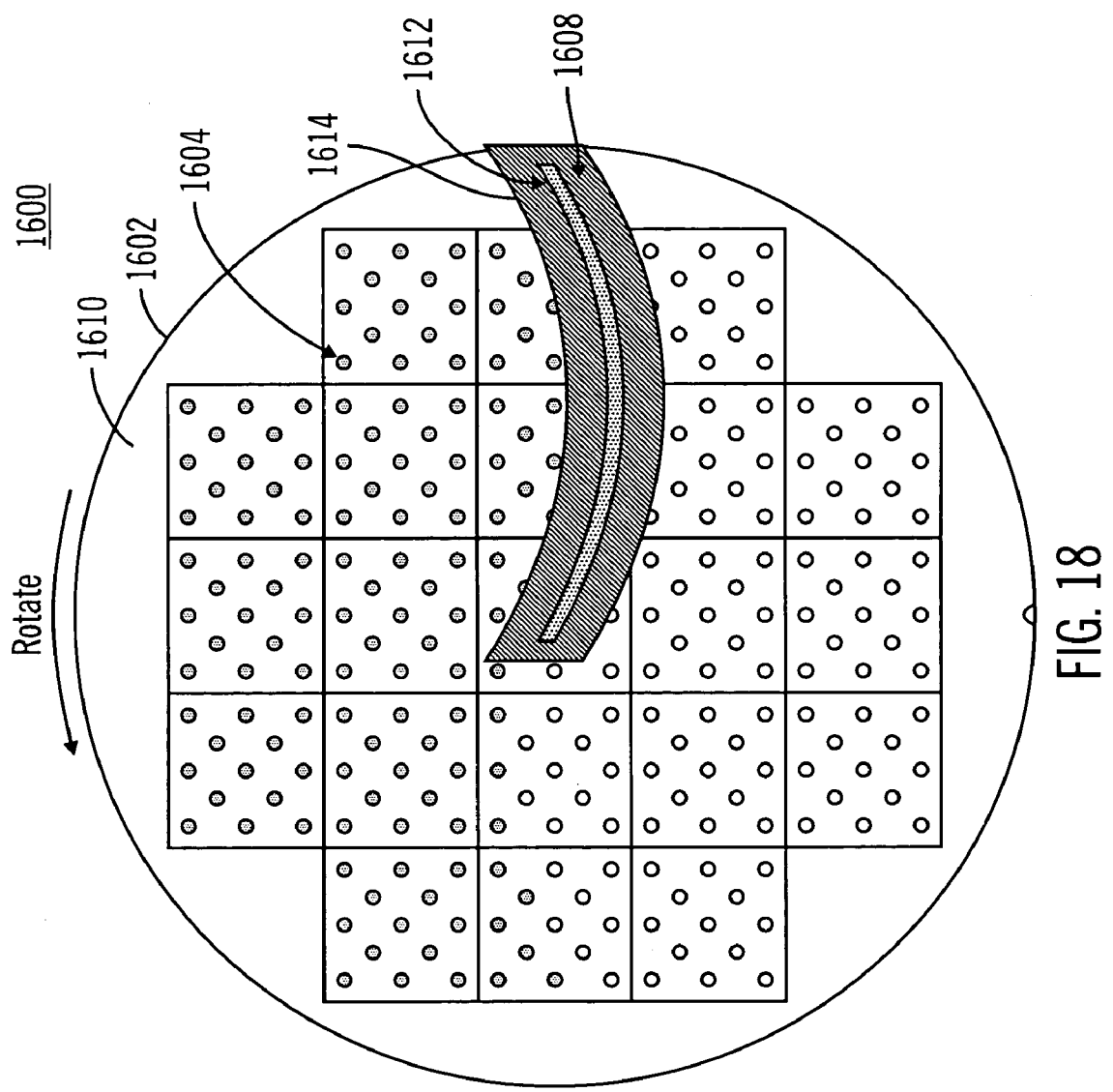
Figure 19:
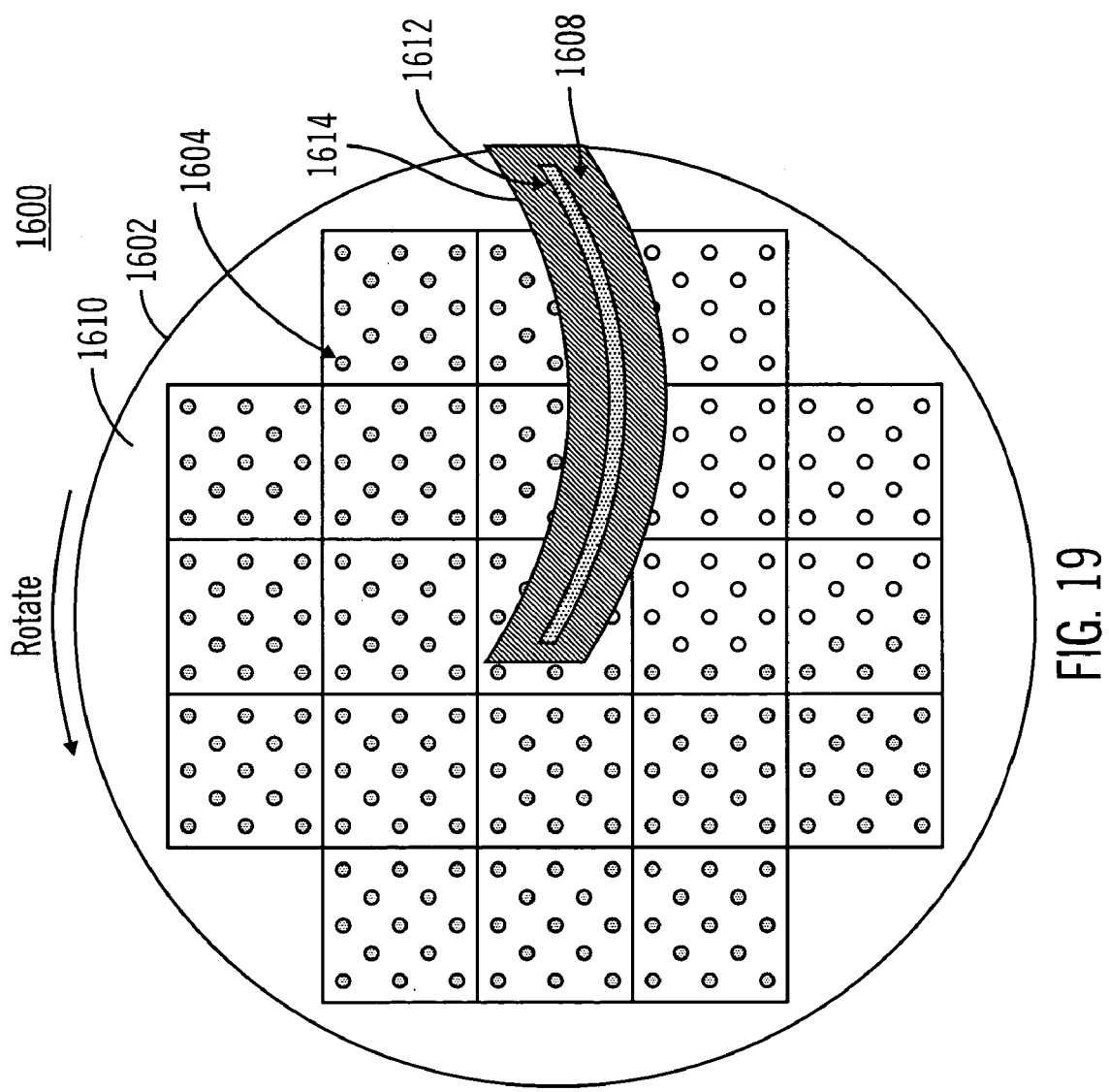
Figure 20:
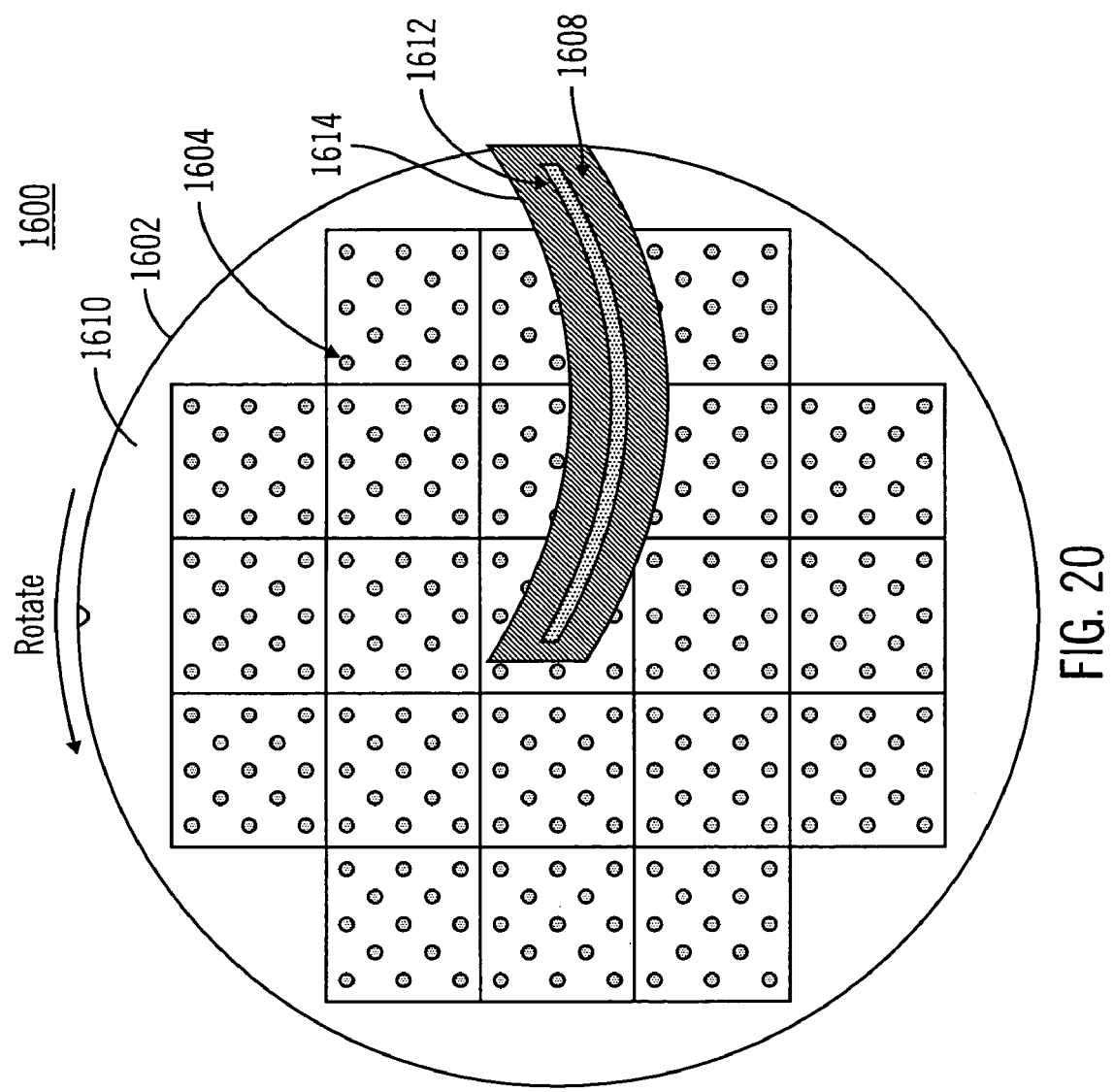

FIGS. 13-15 show another embodiment of the present invention wherein a parking blade 1344 is coupled to the non-rectangular mold 1002 so that the non-rectangular mold 1002 can transition to an adjacent non-rectangular mold (not shown) without spillage of the solder. The parking blade 1344 has a width greater than the fill head 1008. As the non-rectangular mold 1002 is shuttled so that narrower portions of the non-rectangular mold 1002 pass under the filler head 1008, the fill head 1008 extends beyond the edges of the non-rectangular mold 1002. Without the parking blade 1344, solder will spill out of the fill head 1008 causing waster and/or the filled cavities 104 to be compromised. The parking blade 1344 allows for a smooth transition of the fill head 1008 to the next non-rectangular mold 1002 by keeping substantial contact with the fill head 1008.

Exemplary IMS System Utilizing a Fill Head of a Third Type

FIGS. 16-20 show an IMS system 1600 implementing a substantially curved fill head 1608, according to an embodiment of the present invention. FIGS. 16-20 show a progressive sequence in 90 degree increments of the non-rectangular mold 102 being filled with molten solder while rotating 360 degrees. The substantially curved fill head 1608, in one embodiment, is substantially curved relative to the curvature of the perimeter 1630 of the non-rectangular mold 1602. The substantially curved fill head 1608 is aligned along a radius of the non-rectangular mold 1602. As the non-rectangular mold 1602 is rotated up to 360 degrees, the cavities 1604 pass under the delivery slot 1612. Back pressure is applied to the reservoir (not shown) causing molten solder to flow out of the fill head 1612 and onto the top surface 1610 of the non-rectangular mold 1602. The optional fill blade (not shown) forces the molten solder into the cavities 1604. As the cavities 1604 with molten solder pass under the trailing edge 1614 of the substantially curved fill head 1608, the molten solder is solidified.

Figure 21:
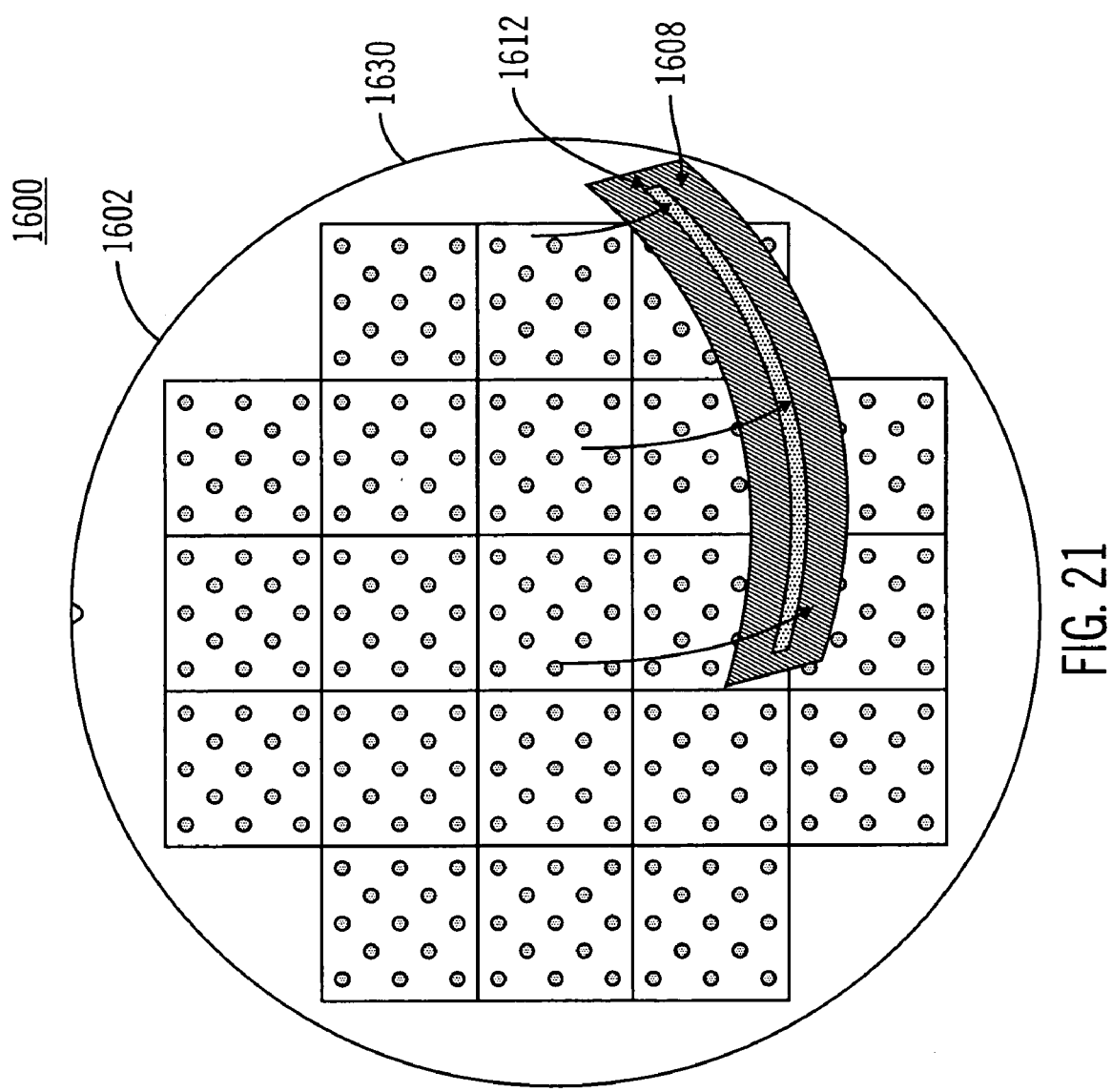
FIGS. 21-22 are top views of an IMS system illustrating a progressive sequence of transitioning the fill head of the third type from a non-rectangular mold after filling cavities in the mold with a conductive bonding material, according to an embodiment of the present invention.
Figure 22:
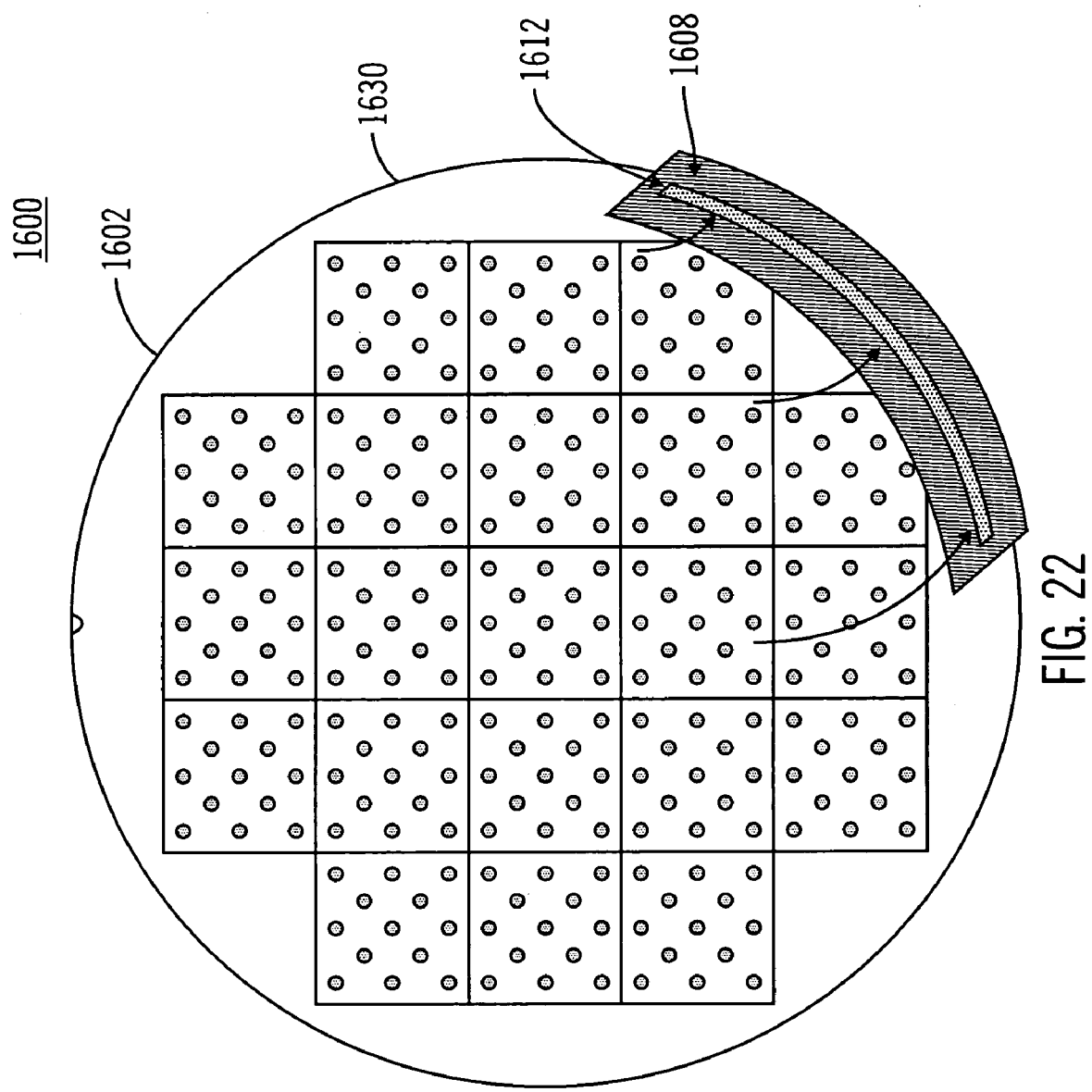

After the cavities 1604 have been filled, the substantially curved fill head 1608 is transitioned to the next non-rectangular mold 1602 by pivoting the substantially curved fill head 1608. For example, FIGS. 21-22 show the substantially curved fill head 1608 being pivoted so that the substantially curved fill head 1608 passes over the outer perimeter 1630 of the non-rectangular mold 102. The delivery slot 1612 is aligned with the outer perimeter 1630, as shown in FIGS. 21-22. The substantially curved fill head 1608 is able to maintain substantial contact with the non-rectangular mold 1602 throughout the transition to an adjacent mold (not shown) without the use of a parking blade. In this embodiment, the non-rectangular molds 1602 are situated with respect to one another so that a minimal gap is produced between the molds 1602. In another embodiment, the substantially curved fill head 1608 remains stationary as the next non-rectangular mold (not shown) is transitioned under the substantially curved fill head 1608.

Exemplary Fill Head

Figure 23:
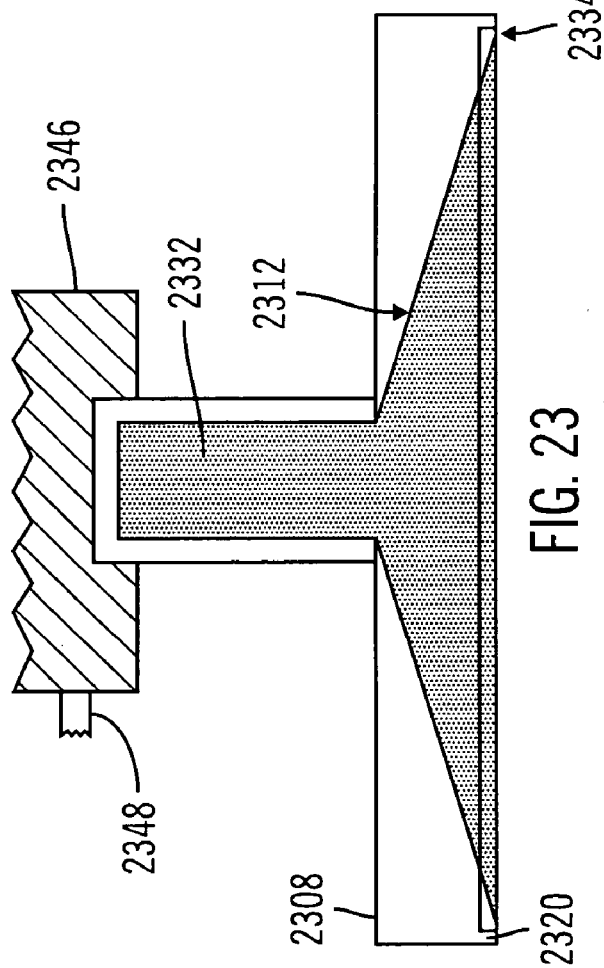
FIG. 23 is a cross-sectional view of a IMS fill head, according to an embodiment of the present invention.
Figure 24:
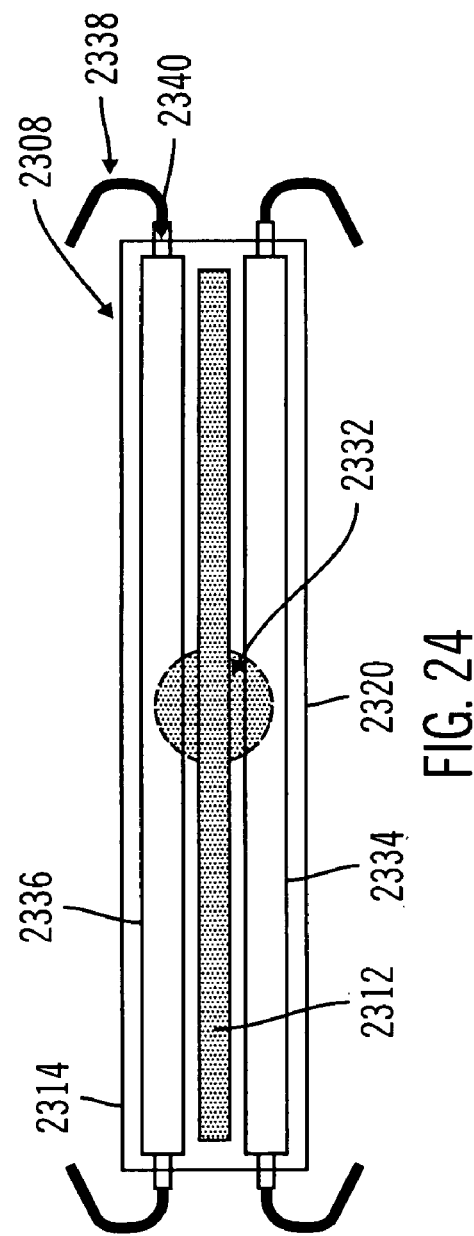
FIG. 24 is a planar view of the IMS fill head of FIG. 23, according to an embodiment of the present invention.

FIGS. 23 and 24 show a cross sectional view and a planar view, respectively, of a fill head 2308 according to an embodiment of the present invention. The fill head 2308 has a conductive bonding material reservoir 2346 for retaining conductive bonding material to be deposited into cavities of a mold. A back pressure is applied by injecting gas through a back pressure port 2348 and into the reservoir 2346. As conductive bonding material such as solder is heated, it flows from the reservoir 2346 through a channel 2332 and into a delivery slot (or slit) 2312. The delivery slot (or slit) 2312 allows the molten solder to flow onto a top surface of a non-rectangular mold. The fill head 2312 also includes an optional fill blade (not shown). The optional fill blade (not shown) guides the molten solder into the cavities of the non-rectangular mold and prevents leakage of the molten solder.

The fill head 2308 also includes gas channels 2334, 2336 for retaining gas provided by gas ports 2340. Each gas channel is situated along an edge 2314, 2320 of the fill head 2308. Gas lines 2338 coupled to the gas ports 2340 transport gas to the gas channels 2334, 2336. Depending on the direction of rotation applied to the non-rectangular mold and/or the fill head 2308, one of the gas channels 2334, 2336 retains a gas having a temperature above the melting point of the material in the material reservoir 2346. The gas channel(s) 2334, 2336 carrying the "hot" gas are situated in the fill head 2308 so that the solder remains molten as it is being delivered to the cavities 102. The other gas channel 2334, 2336 retains a gas having a temperature below the melting point of the material. This allows the molten material in the cavities to solidify as the cavities 104 pass under the region of the fill head 108 channeling the "cool" gas.

Another Exemplary Fill Head

Figure 25:
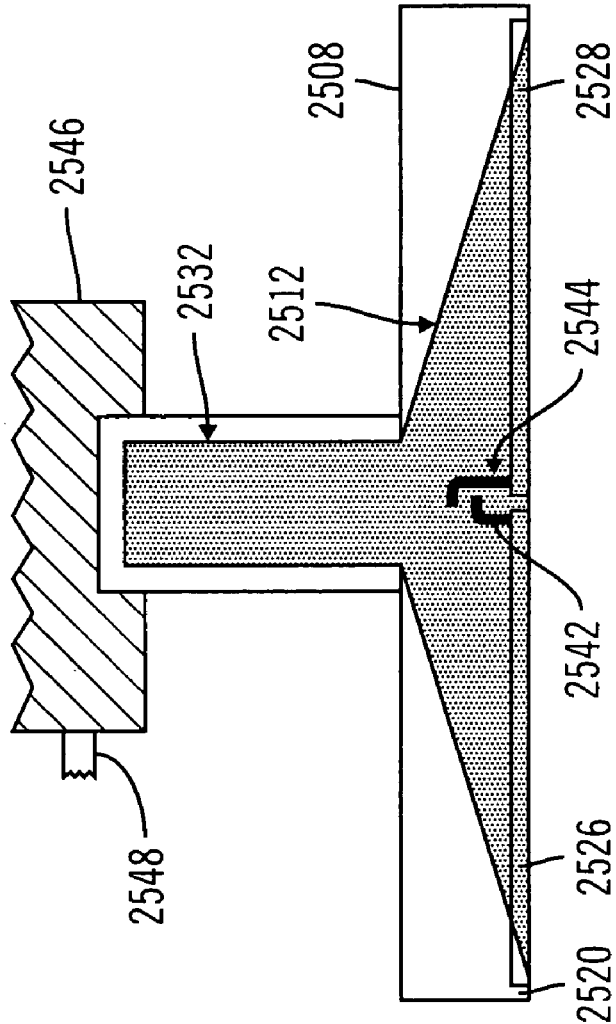
FIG. 25 is a cross-sectional view of another IMS fill head, according to an embodiment of the present invention.
Figure 26:
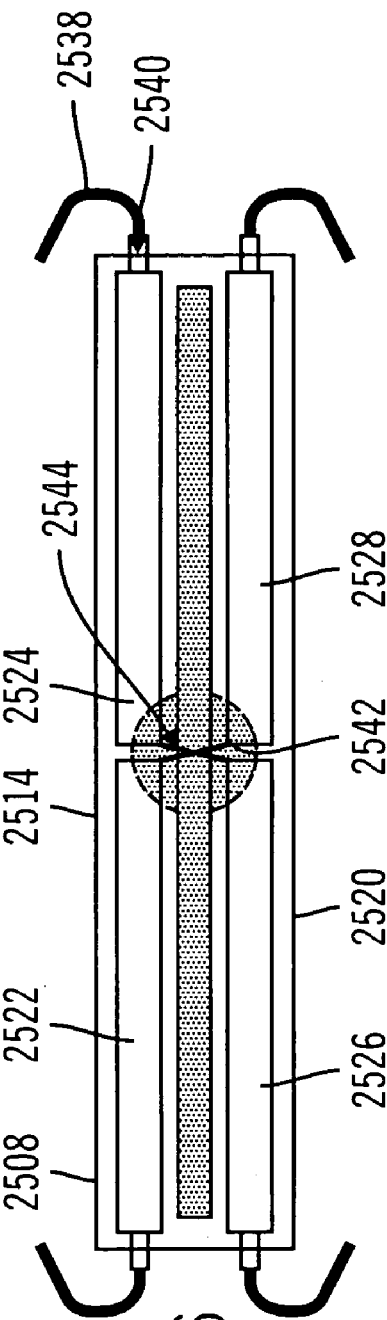
FIG. 26 is a planar cross-sectional view of the IMS fill head of FIG. 25, according to an embodiment of the present invention.

FIGS. 25-26 show a fill head 2508 according to another embodiment of the present invention. The fill head 2508 of FIGS. 25 and 26 include a reservoir 2546, back pressure port 2548, and a delivery slot 2512 similar to the fill head 2308 of FIGS. 23 and 24. However, at least two gas channels 2522, 2524, 2526, 2528 are included at each edge 2514, 2520 of the fill head 2508. For example, a first edge 2514 of the fill head 2508 includes a first gas channel 2522 and a second gas channel 2524 similar to the fill head 1008 as described with respect to FIG. 11. A second edge 2520 of the fill head 2508 includes a third gas channel 2526 and a fourth gas channel 2528 similar to the fill head 1008 as described with respect to FIG. 11. The first gas channel 2522 of the first edge 2514 of the fill head 2508 is coupled to the fourth gas channel 2528 of the second edge 2520 of the fill head 2508 via a first coupling channel 2542. Similarly, the second gas channel 2524 of the first edge 2514 of the fill head 2508 is coupled to the third gas channel 2526 of the second edge 2520 of the fill head 2508 via a second coupling channel 2544. For simplicity, FIG. 25 shows only a portion of the coupling channels 2542, 2544. However, the coupling channels 2542, 2544, in one embodiment, cross over/under each other to connect the first gas channel 2522 to the third gas channel 2528 and the second gas channel 2524 to the fourth gas channel 2526, respectively, as shown in FIG. 26. The coupling channels 2542, 2544 allow for different gases to be placed in different areas of the fill head 2508.

For example, as described with respect to the fill head 1008 of FIG. 11, when a fill head 1008 is used that runs the diameter of the non-rectangular mold 1002; solder is deposited in two different directions. Having the gas channels configured as in FIGS. 25 and 26 allows for solder to be in close proximity with one gas thereby keeping the solder molten. The configuration of the gas channels also allows for the molten solder to be solidified in the cavities 104 as the cavities 104 pass under a region of the fill head 2508 channeling a "cool" gas. Coupling the gas channels via coupling channels 2452, 2544 also allows for the cooling and heating gases to be placed in different channels according to the rotation of the mold 102 and/or the fill head 108.

Channeling a hot gas and a cool throughout the fill head 2508 (at least in specific regions of the fill head 2508) allows for more control over the temperature of the fill head 2508 and the solder. For example, the heat/cool load from the mold 102 can change the temperature of the solder. Without the channeling of gases, the reservoir needs to be heated at a much higher temperature so that the solder does not solidify prematurely. In another embodiment, thermocouple probes (not shown) are situated in at least one of the edges 2514, 2520 of the fill head 2508 to provide accurate temperature monitoring and feedback.

The fill heads 2308 and 2508 as described in FIGS. 23-26 are not only advantageous for use with non-rectangular molds but are also advantageous for use with rectangular molds.

Current fill heads have resistive heaters within the head. The heater is built into the surface of the fill head where the head contacts the mold being filled. A time delay is experienced because of the time it takes for the heat to be generated in the line and then the conduction of the head. Furthermore, these fill heads do not have any means for cooling the solder within the cavities. The fill heads of the present invention do not experience the time delays as described above. Furthermore, the fill heads of the present invention provide a means to cool the molten solder as the cavities pass under the fill head.

Exemplary Process of Filling a Non-Rectangular Mold with Solder

Figure 27:
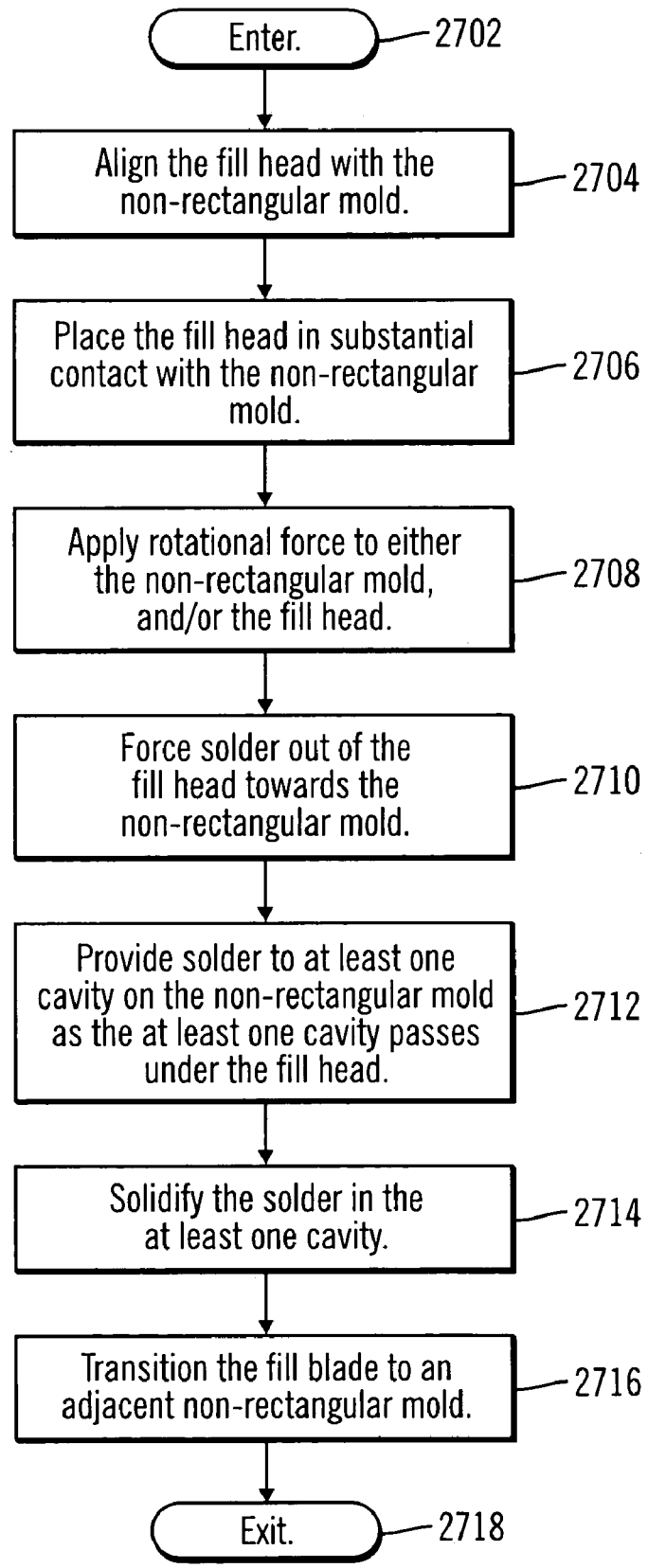
FIG. 27 is an operational flow diagram illustrating an exemplary process of filling non-rectangular molds using rotational fill techniques.

FIG. 27 is an operational flow diagram showing the exemplary process of filling cavities in a non-rectangular mold using rotational fill techniques. The operational flow diagram of FIG. 27 begins at step 2702 and flows directly to step 2704. The fill head, at step 2704, is aligned with the non-rectangular mold 102. For example, the fill head 108 is aligned along a radius or a diameter depending on the type of fill head used. The fill head 108, at step 2706, is placed in substantial contact with the non-rectangular mold 102. A rotational force, at step 2708, is applied to either the non-rectangular mold 102 and/or the fill head 108. Solder, at step 2710, is forced out of the fill head 108 towards the non-rectangular mold 102. For example, a back pressure is applied to a reservoir 2346 forcing the solder to flow through a channel 2348 and out of the fill head 108. A gas channel is included at an edge of the fill head 108 with a gas having a temperature above the melting point of the solder. This allows the solder to remain liquefied or molten as the solder contacts the gas.

Solder, at step 2712, is provided to at least one cavity on the non-rectangular mold 102 as the at least one cavity passes under the fill head 108. An optional fill blade (not shown) exhibits a squeegee effect and guides the molten solder down into the cavity. The solder in the at least one cavity, at step 2714, is solidified as the solder comes into contact with a second gas having a temperature below the melting point of the solder. The fill head 108, at step 2716, is transitioned onto an adjacent non-rectangular mold 102. In some instances it may be necessary to use a parking blade to assist in the transition to avoid spillage of the solder. The control flow then exits at step 2718.

NON-LIMITING EXAMPLES

The foregoing embodiments of the present invention are advantageous because they provide a technique for filling non-rectangular molds or substrates with a conductive bonding material using an IMS system. The present invention allows for molds that more closely resemble their associated wafer to be used. Furthermore, the fill heads of the present invention provide a means for channeling gases throughout the heads that melt material to be deposited into cavities of a mold and solidify the material within the cavities.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of injection molding solder into a plurality of cavities in a non-rectangular mold, the method comprising:

aligning a substantially curved fill head with a non-rectangular mold, wherein the substantially curved fill head is curved to match a curvature of a perimeter of the non-rectangular mold, wherein the non-rectangular mold includes a plurality of cavities and is a circular shape; and wherein aligning the fill head comprises:

aligning the fill head along a radius of the non-rectangular mold, the fill head being slightly longer than a diameter of the non-rectangular mold, the fill head being configured to provide solder to the plurality of cavities bi-directionally;

placing the fill head in substantial contact with the non-rectangular mold creating a squeegee effect across the non-rectangular mold; and providing rotational motion to the fill head while the fill head is in substantial contact with the non-rectangular mold, wherein providing rotational motion provides a relative rotation of substantially up to 360 degrees between the fill head and the non-rectangular mold to provide the solder into each cavity in the plurality of cavities; and the method further comprising:

forcing solder out of the fill head toward the non-rectangular mold;

providing the solder into each cavity in the plurality of cavities contemporaneous with each cavity being in proximity to the fill head;

receiving temperature feedback from at least one thermocouple situated within the fill head;

channeling a first gas about a first edge of the fill head, the first gas having a temperature above a melting point of the solder thereby maintaining the solder in a molten state as the solder and the at least first gas are in close proximity to one another;

channeling a second gas about a second edge of the fill head, the second gas having a temperature below the melting point of the solder thereby substantially solidifying the solder within each cavity as the each cavity passes under the second region of the fill head with the at least second gas; and transitioning the fill head from the non-rectangular mold, the fill head passing over an adapter coupled to the non-rectangular mold, to an adjacent non-rectangular mold as the fill head transitions from the non-rectangular mold to the adjacent non-rectangular mold thereby preventing spillage of solder from the fill head that is transitioning, wherein transitioning the fill head comprises:

retracting the solder back into the fill head by releasing a back pressure associated with forcing the solder out of the fill head.

* * * * *